US006850051B2

(12) United States Patent
Roberts et al.

(10) Patent No.: US 6,850,051 B2
(45) Date of Patent: Feb. 1, 2005

(54) TIMING MEASUREMENT DEVICE USING A COMPONENT-INVARIANT VERNIER DELAY LINE

(75) Inventors: Gordon W. Roberts, Montreal West (CA); Antonio H. Chan, Brossard (CA)

(73) Assignee: McGill University, Montreal (CA)

(*) Notice: Subject to any disclaimer, the term of this patent is extended or adjusted under 35 U.S.C. 154(b) by 73 days.

(21) Appl. No.: 10/105,434

(22) Filed: Mar. 26, 2002

(65) Prior Publication Data

US 2003/0006750 A1 Jan. 9, 2003

Related U.S. Application Data

(60) Provisional application No. 60/278,441, filed on Mar. 26, 2001.

(51) Int. Cl.[7] .............................................. G01R 23/175
(52) U.S. Cl. .................................................... 324/76.54
(58) Field of Search ............................. 324/76.54, 532, 324/535, 613, 617, 620; 702/69, 191

(56) References Cited

U.S. PATENT DOCUMENTS 4,164,648 A 8/1979 Chu ...................... 235/92 FQ
5,293,520 A * 3/1994 Hayashi .................. 324/76.77
6,295,315 B1 * 9/2001 Frisch et al. ............... 375/226

* cited by examiner

*Primary Examiner*—Anjan Deb
*Assistant Examiner*—Donald M. Lair
(74) *Attorney, Agent, or Firm*—Downs Rachlin Martin PLLC

(57) ABSTRACT

In recent years, much effort has been placed on improving the performance of timing and jitter measurement devices using Delay Locked Loop (DLL) and Vernier Delay Line (VDL) techniques. However, these approaches require highly matched elements in order to reduce differential non-linearity timing errors. In an attempt to reduce the requirement on element matching, a component-invariant VDL technique is disclosed that enables the measurement device to be synthesized from an RTL description. The present invention is based on a single-stage VDL structure, which is used to mimic the behavior of a complete VDL. Furthermore, as test time is an important consideration during a production test, a method and system is provided that reduces test time at the expense of additional hardware.

40 Claims, 16 Drawing Sheets

TIMING MEASUREMENT DEVICE USING A COMPONENT-INVARIANT VERNIER DELAY LINE

CROSS-REFERENCE TO RELATED APPLICATIONS

This application is based on, and claims benefit under 35 U.S.C. 119(e) of, U.S. patent application Ser. No. 60/278,441, filed Mar. 26, 2001.

MICROFICHE APPENDIX

Not Applicable.

TECHNICAL FIELD

The present invention relates to high-resolution timing measurements and, in particular, to a timing measurement system and method using a component-invariant Vernier Delay Line.

BACKGROUND OF THE INVENTION

An accurate measure of the jitter characteristics of a signal waveform or, alternatively, a measure of the timing variation between a signal waveform and a reference waveform can yield important information relating to the performance of the source of the signal waveform. Accordingly, the performance of timing and jitter measurement devices is a key factor in being able to accurately characterize the performance of a signal waveform source (e.g. a phase-locked loop). To this end, much recent effort has been devoted to improving the performance and resolution of such timing and jitter measurement devices.

Performing a jitter measurement on a data signal with sub-gate resolution can be achieved using two delay chains feeding into the clock and data lines of a series of D-latches as shown in FIG. 1. Such a structure has come to be known in the art as a Vernier Delay Line (VDL). Here it is assumed that the clock signal is jitter-free. In this case, then, the jitter measurement may be defined as a measure of the time interval between the rising edge of the data signal and the rising edge of the clock signal. The symbols $\tau_f$ and $\tau_s$ represent the respective propagation delays of the buffers interconnecting each stage of the VDL. As the propagation delays of the clock and data paths differ by an amount of $\Delta\tau=(\tau_s-\tau_f)$ the time difference between the rising edges of the data and clock signals will correspondingly decrease by $\Delta\tau$ after each stage of the VDL. After each stage, the phase relationship between these two rising edges is detected and recorded by a corresponding D-latch. A logical 0 will result when the clock signal leads the data signal, whereas a logical 1 will result when the data signal leads the clock signal. The output of each D-latch is passed to a counter circuit, which simply counts the number of times the data signal leads the clock signal (i.e., the number of logical 1's) with a delay difference set by its position in the VDL.

By design, the data signal in FIG. 1 will be made to always lead the clock signal at the input of the VDL by incorporating an additional delay (not shown) after the clock input. Subsequently, as the data and clock signals progress through each stage of the VDL, a point will be reached where the data signal will start to lag the clock signal on account of the extra delay, $\Delta\tau$, in its signal path. All D-latches subsequent to this point will register logical 0, whereas all D-latches before this point will register a logical 1. In any event, a counter after each stage of the VDL is used to register the state of each corresponding D-latch.

As the phase between the data and clock signals at the input of the VDL is a random variable, each time the measurement is performed, a different set of D-latches are set to a logical 1 level and the corresponding counters begin to register different values. In the case of the first counter, for example, its count value reflects the number of times the rising edge of the data signal is ahead of the rising edge of the clock signal with a delay greater than $\Delta\tau$. Likewise, the counter in the next stage will correspond to the number of times the rising edge of the data signal leads the rising edge of the clock signal with a delay greater than $2\Delta\tau$. In the same manner, the following stages correspond to the number of times the data signal leads the clock signal by $3\Delta\tau$, $4\Delta\tau$, and so on and forth. Statistically, these numbers can be viewed as representing the Cumulative Distribution Function (CDF) of the jitter riding on the data signal. The Probability Density Function (PDF), or what is also referred to as a histogram, can then be obtained by taking the derivative of the CDF.

Alternatively, a histogram of jitter can also be derived from the data generated by a VDL. For example, if one assumes that the period of the data and clock signal, denoted as T, is larger than the total propagation delay through an M-stage VDL, approximately $M\tau_s$ if we assume $\tau_s>\tau_f$, then the outputs of all the D-latches may be combined into one bit-stream whose total count of logical 1's represents the actual time difference between the edge of the data and clock signal taken at a particular instant in time. As is shown in FIG. 2, this may easily be achieved by "OR"-ing the outputs of all the D-latches and counting the number of logical 1's over the time period T. Therefore, repeating the measurement N times enables a histogram of jitter to be similarly constructed.

An important drawback to the prior art VDL structures shown in FIGS. 1 and 2 is that measurement accuracy depends on the matching of delay elements between successive stages. Mismatches in delay elements can lead to errors in the CDF or histogram collected. In other words, these approaches require highly matched elements in order to reduce differential non-linearity timing errors. Although careful layout techniques may help in minimizing these mismatches, they cannot eliminate them completely.

In general, Time-to-Digital Converter (TDC) using a Delay Locked Loop (DLL), Vernier Delay Line (VDL) and ring oscillator phase digitization are common techniques used to provide high-resolution timing measurements. In recent years, on-chip timing measurements, such as jitter characterization of Phase Locked Loops (PLLs), have become extremely demanding with required timing resolutions less than 100 ps In order to meet these needs, researchers have devised various schemes in which to perform on-chip timing measurements. In S. Sunter and A. Roy, entitled "BIST for phase-locked loops in digital applications", and published in Proc. IEEE International Test Conference, pp. 532–540, 1999, an on-chip circuit consisting of a ring oscillator and a calibration circuit was reported to be able to perform timing measurements with a resolution as low as a single gate delay. Moreover, the circuit was fully synthesizable from an RTL description, as the design did not depend on matched elements. A significant improvement to sub-gate resolution was recently reported using a VDL. In this case, the timing resolution was said to be derived from the difference of two gate delays. Unfortunately, however, the reported design still depends largely on the matching of pairs of delay elements. Accordingly, a timing measurement method and system that avoids dependency on matched delay lines remains highly desirable.

SUMMARY OF THE INVENTION

Accordingly, an object of the present invention is to avoid the dependency on element matching of prior art timing and jitter measurement devices by providing a component-invariant VDL structure. Thus, the present invention provides a single-stage VDL structure, which is used to mimic the behavior of a complete VDL. This is accomplished by feeding the output of one stage of a VDL back to its input. In fact, this is equivalent to having two oscillators running simultaneously with different frequencies to produce a constant delay difference during every cycle of oscillation. By extending the circuit structure to include multiple oscillators, measurement time is reduced by a factor equivalent to the number of additional oscillators.

According to one aspect of the present invention, there is provided a method for measuring a time difference between a first event and a second event comprising the steps of: triggering a first oscillator circuit to generate a first oscillation signal with an oscillation period $T_s$ upon detection of said first event; triggering a second oscillator circuit to generate a second oscillation signal with an oscillation period $T_f$ upon detection of said second event, wherein $T_B$ is greater than $T_f$ and wherein a difference, $\Delta T$, between $T_s$ and $T_f$ is small with respect to either of $T_s$ and $T_f$; counting a number of cycles, $N_m$, of said second oscillator circuit; detecting a change of phase between said first and second oscillation signals; and determining a time difference between said first and said second events from said difference, $\Delta T$, between $T_s$ and $T_f$ and the count of the number of cycles of said second oscillator circuit at which said detected change of phase occurs.

According to a further aspect of the present invention, there is provided an apparatus for measuring a time difference between a first event and a second event comprising: a first oscillator circuit adapted to generate a first oscillation signal with an oscillation period $T_s$ upon detection of said first event; a second oscillator circuit adapted to generate a second oscillation signal with an oscillation period $T_f$ upon detection of said second event, wherein $T_s$ is greater than $T_f$ and wherein a difference, $\Delta T$, between $T_s$ and $T_f$ is small with respect to either of $T_s$ and $T_f$; means for counting a number of cycles of said second oscillator circuit; means for detecting a change of phase between said first and second oscillation signals; means for determining the time difference between said first and said second events using said difference $\Delta T$ between $T_s$ and $T_f$ and the count of the number of cycles of said second oscillator circuit at which said detected change of phase occurs.

According to a further aspect of the present invention, there is provided a method for measuring a time difference between a first signal and a reference signal using a first oscillator circuit adapted to generate a first oscillation signal having a period $T_s$ and a second oscillator circuit adapted to generate a second oscillation signal having a period $T_f$, said method comprising the steps of: performing a calibration sequence to determine the oscillation period $T_s$ of said first oscillator circuit, the oscillation period $T_f$ of said second oscillator circuit and a measure of an intrinsic path delay difference between said first and second signals; triggering said first oscillator circuit to generate said first oscillation signal in response to said first signal; triggering said second oscillator circuit to generate said second oscillation signal in response to said reference signal, wherein $T_\epsilon$ is greater than $T_f$ and wherein a difference, $\Delta T$, between $T_s$ and $T_f$ is small with respect to either of $T_s$ and $T_f$; counting a number of cycles, $N_m$, of said second oscillation signal; detecting a change of phase between said first and second oscillation signals; and determining the time difference between said first signal and said reference signal from said difference, $\Delta T$, between $T_s$ and $T_f$ and the count of the number of cycles of said second oscillation signal at which said detected change of phase occurs.

BRIEF DESCRIPTION OF THE DRAWINGS

Further features and advantages of the present invention will become apparent from the following detailed description, taken in combination with the appended drawings, in which.

It will be noted that throughout the appended drawings, Like features are identified by like reference numerals.

DETAILED DESCRIPTION OF THE PREFERRED EMBODIMENT

Current timing and jitter measurement devices employing VDL techniques generally require highly matched elements in order to reduce differential non-linearity timing errors. In order to remove this dependency on element matching, the present invention provides a component-invariant VDL structure. The measurement device of the present invention is based on a single-stage VDL structure, which is used to mimic the behavior of a complete VDL. This is accomplished by feeding the output of one stage of a VDL back to its input. In fact, this is equivalent to having two oscillators running simultaneously with different frequencies to produce a constant delay difference during every cycle of oscillation. By extending the circuit structure to include multiple oscillators, measurement, time may be reduced by a factor equivalent to the number of additional oscillators.

Figure 3:
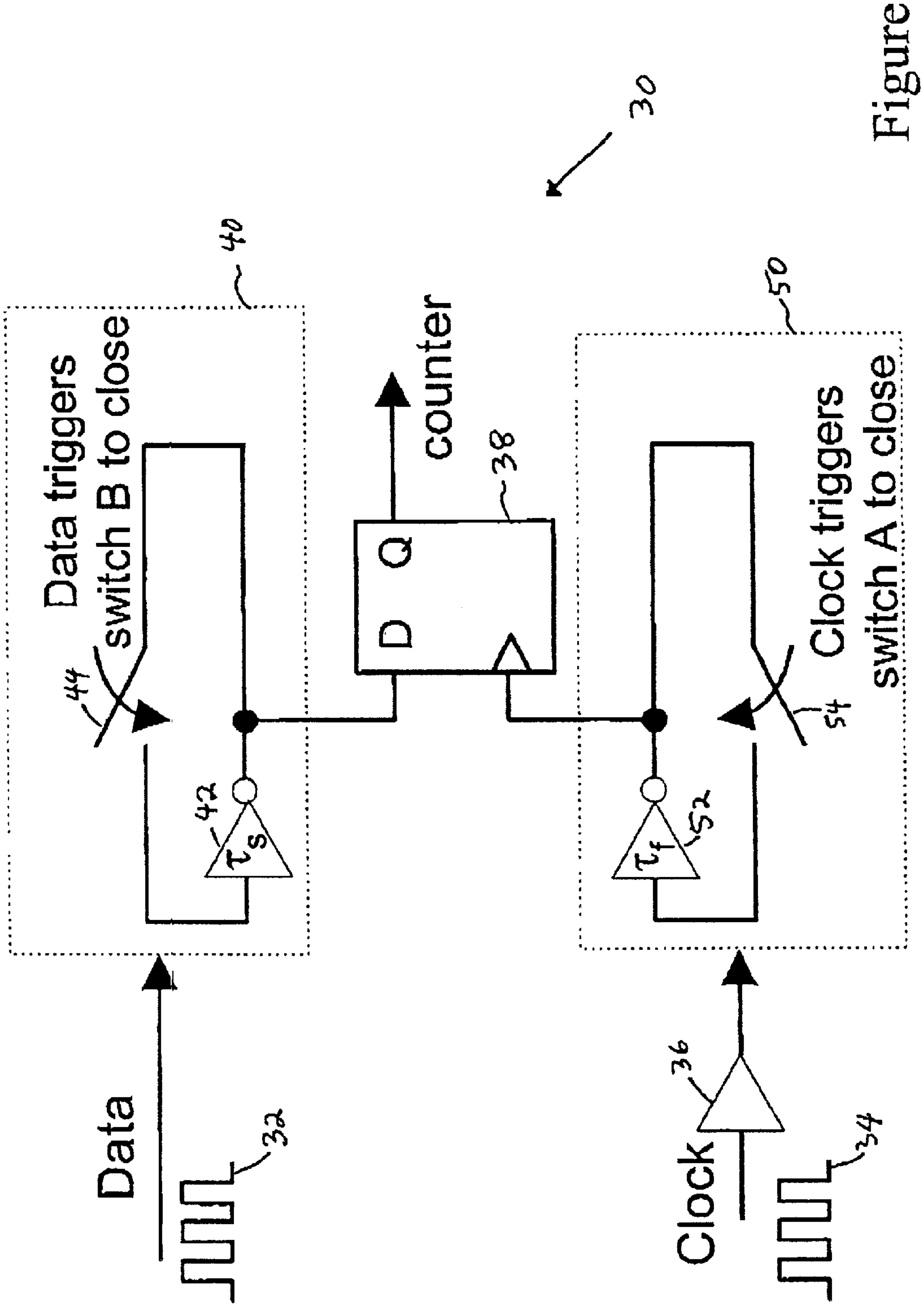
FIG. 3 shows a block diagram of a component-invariant VDL according to the present invention.

FIG. 3 depicts a component-invariant VDL structure 30 according to a first aspect of the present invention. The single-stage VDL structure 30 comprises a data-triggered oscillator circuit 40 which feeds into the data line input of a D-latch 38 and a clock-triggered oscillator circuit 50 which feeds into the clock input of the same respective D-latch 38. The output of the D-latch 38 is passed to a counter (not shown). As per the naming convention, the data-triggered oscillator 40 is triggered by a data signal 32 while the clock-triggered oscillator 50 is triggered by a clock signal 34. The data-triggered oscillator 40 generates an oscillation signal having a period $T_s$ in response to the data signal 32 while the clock-triggered oscillator generates an oscillation signal having a period $T_f$ in response to the clock signal 34. Note that the clock signal 34 is delayed by a buffer 36 before reaching the clock-triggered ring oscillator 50 to ensure that the oscillation signal generated by the data-triggered oscillator 40 always leads oscillation signal generated by the clock-triggered oscillator 50.

The data-triggered oscillator is comprised of a first inverter 42 and a first switch 44. Similarly, the clock-triggered oscillator comprises a second inverter 52 and a second switch 54. Inverters 42 and 52 are used instead of buffers (as in FIGS. 1 and 2) to create the delay difference between the data and clock input signals (i.e. oscillation signals) to the D-latch 38. In addition, the output of each inverter is fed back to its corresponding input, depending on the state of the switch in its feedback path.

When the switches 44, 54 are closed, the inverters 42, 52 are configured with regenerative feedback, and will oscillate with a period of $2\tau_s$ or $2\tau_f$ seconds, depending on the propagation delay $\tau_s$, $\tau_f$ of each inverter. More importantly, the combined effect of the inverters 42, 52 is to delay the leading edge of the data signal 32 with respect to the leading edge of the clock signal 34 by an amount $2\Delta\tau$ seconds for every cycle of the input clock signal.

Figure 1:
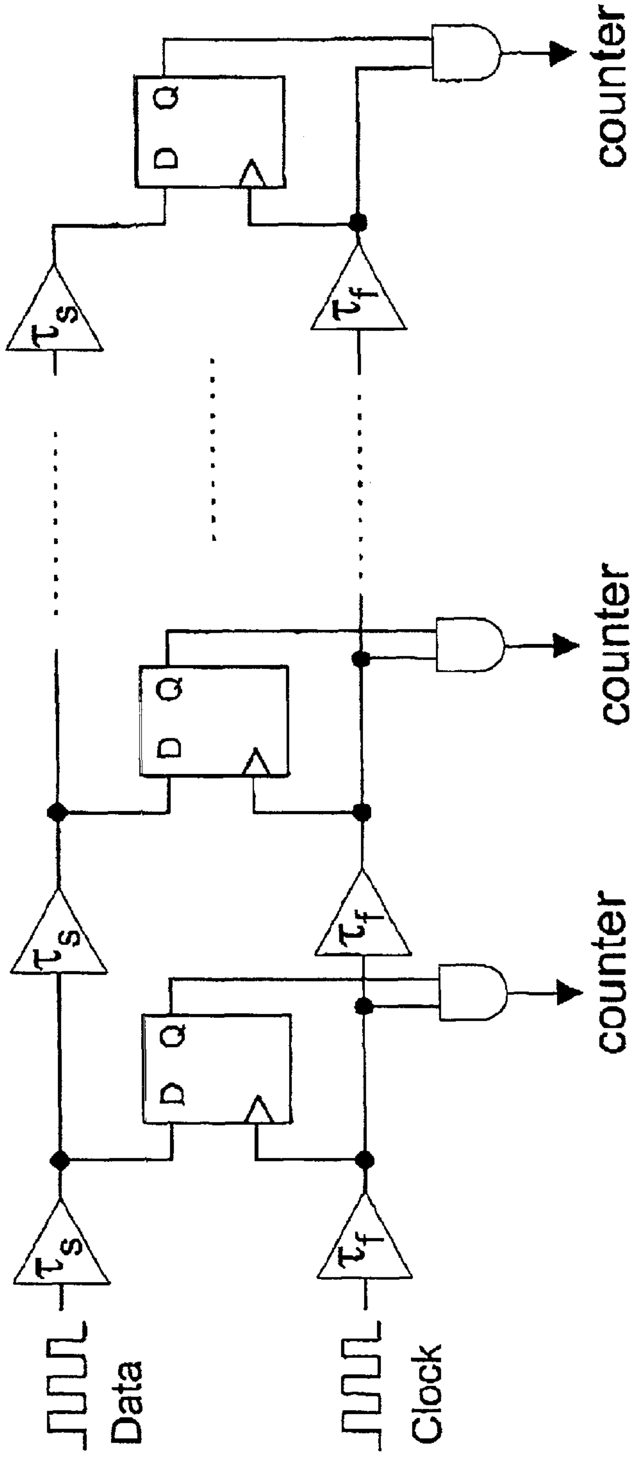
Figure 1 (Prior Art)
FIG. 1 shows a prior art embodiment of a VDL with sub-gate timing resolution.
Figure 2:
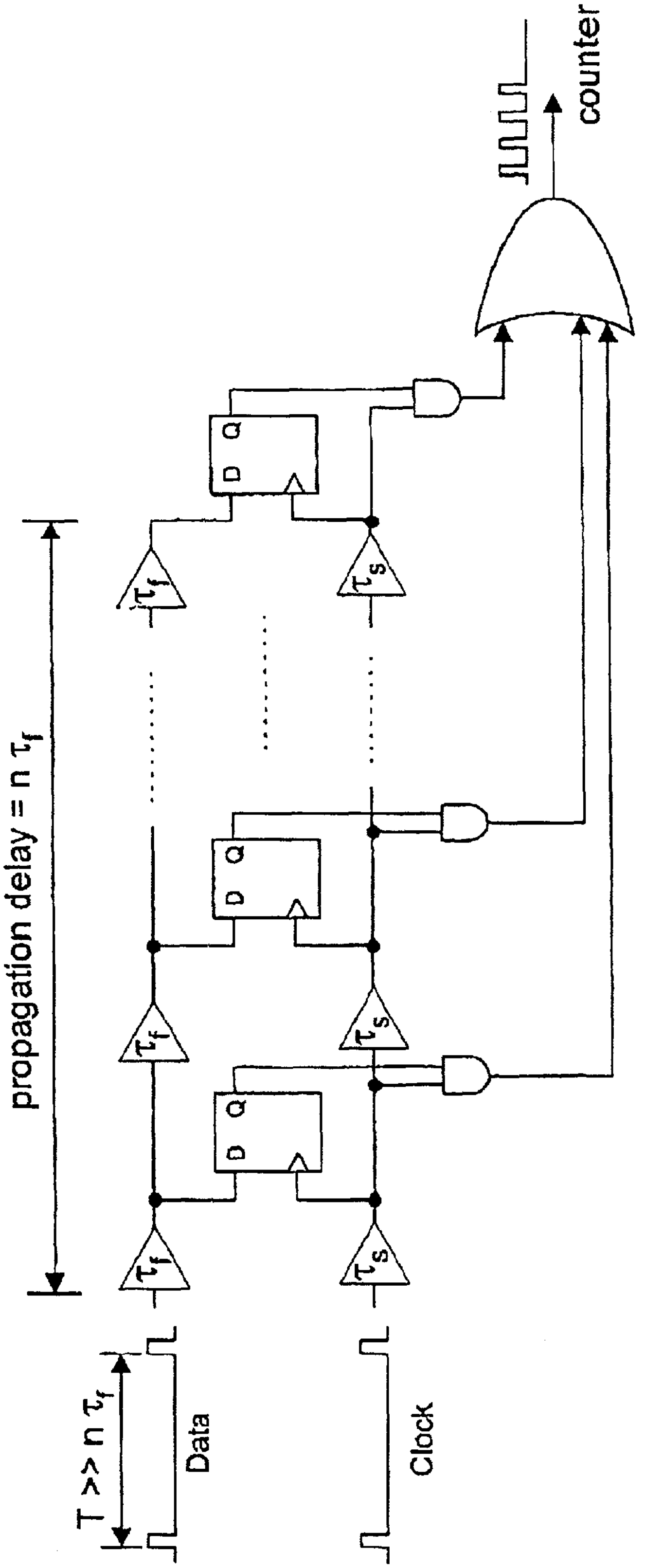
Figure 2 (Prior Art)
FIG. 2 shows a prior art embodiment of a circuit which can obtain a histogram of timing variations directly from a VDL.

The component-invariant VDL structure 30 in FIG. 1 may be used measure the time difference between two periodic signal waveforms. In the case of FIG. 1, for example, the time interval of interest is the time difference between the rising edge of the clock signal 34 and the rising edge of the data signal 32. To ensure an accurate time measurement, the first switch 44 in the feedback path of the inverter 42 controlling the data input of the D-latch 38 must be closed on the rising edge of the data signal 32, whereas the second switch 54 in the feedback path of the inverter 52 controlling the clock input of the D-latch 38 must be closed on the rising edge of the clock signal 34. Conversely, both switches 44, 54 are opened once the relative position of the rising edge of the data-triggered oscillation signal goes from a leading to lagging relationship with respect to the clock-triggered oscillation signal or vice-versa. The output of the D-latch 38 is then passed to a counter (not shown), which simply counts how long the D-latch 38 stays in the logic '1' state and, in turn, computes the time difference between the rising edges of the data and clock signal. Therefore, the single-stage VDL structure 30 of FIG. 3 can be used to mimic the behavior of a complete VDL. By utilizing the same delay elements in each stage, mismatches are completely eliminated. The process may then be repeated a number of times to derive a histogram of the jitter riding on the data signal.

As may be appreciated, the timing measurement system and method described in FIG. 3 may be implemented using standard CMOS integrated circuitry. In this respect, the component-invariant VDL of the present invention can be reduced to three main circuit components i.e. edge detectors, oscillators and a phase detector. The basic structure and function of these three main components will now be detailed.

Figure 4A:
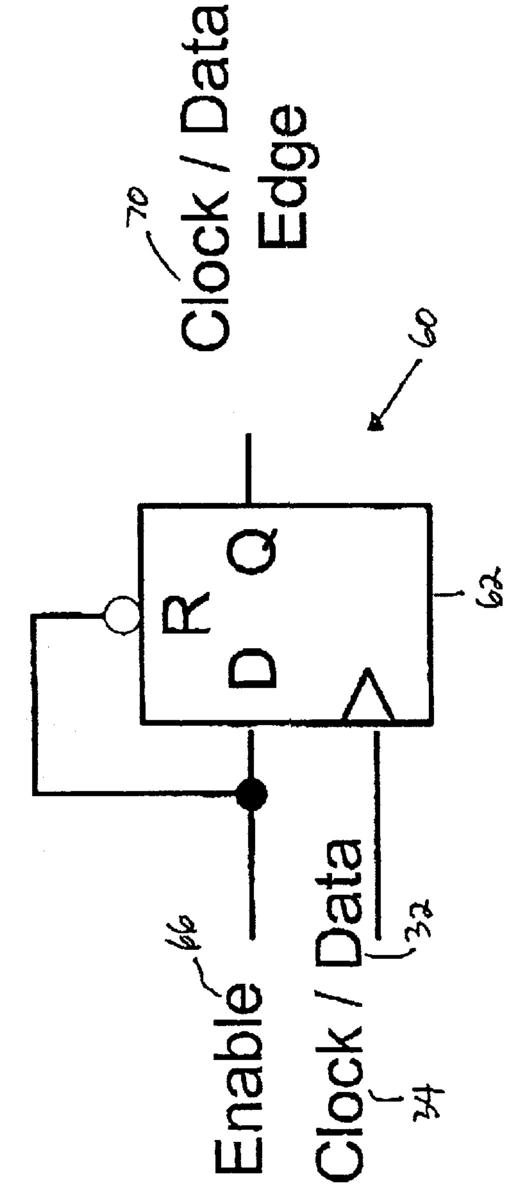
FIG. 4*a* shows an edge detector implementation which may be used in accordance with the present invention.

FIG. 4*a* shows an exemplary edge detector 60 which may be used in a practical implementation of the present invention. As shown, the edge detector 60 may be implemented using a single D-Flip-Flop 62 with the D and reset (R) inputs connected together. An enable signal 66 is delivered to the D-input while the clock signal 34 (or data signal 32) to be monitored is delivered to the clock input of the D-Flip-Flop 62. The output (Q) of the edge detector 60 will, then, correspond to an output clock edge signal 70 (or data edge signal). The main function of the edge detector 60 is to catch the rising edge of the data or clock signal for triggering of respective oscillators 40 or 50. In a preferred embodiment, two edge detectors will be required, one for the data signal 32 and one for the clock signal 34.

Figure 4B:
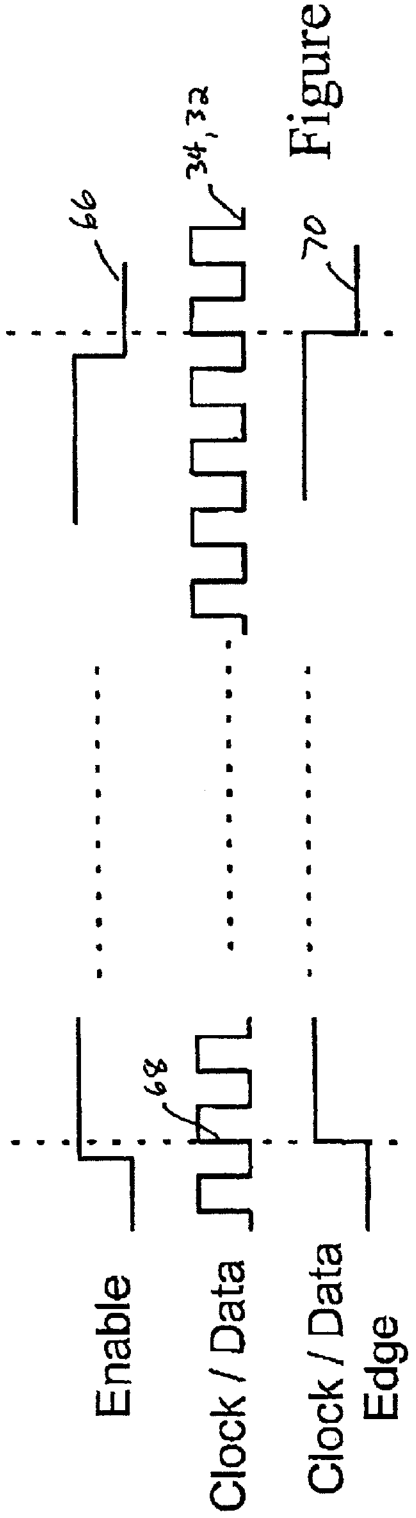
FIG. 4*b* shows the timing behavior of the edge detector implementation in FIG. 4*a*.

FIG. 4*b* is a timing diagram illustrating sample operation of the edge detector 60 shown in FIG. 4*a*. As the enable signal 66 switches from logical '0' to '1', the subsequent rising clock or data edge 68 will cause the output clock/data edge signal 70 to switch from logical '0' to '1' until the enable signal 66 is set back to logical '0' (or low). In this way, the rising edges of the data and clock signals 32, 34 may be detected in order to trigger respective oscillators 40, 50.

At the heart of the component-invariant VDL structure of the present invention are the two switched oscillator circuits 40, 50 depicted in FIG. 3. Implementation of the switched oscillator circuits 40, 50 may, for example, take the form of the circuitry shown in FIG. 5. Here, a clock-triggered oscillator 80 comprises an AND gate 84 feeding into an XOR gate 86, the output of which is fed back to a first input of the AND gate 84. A second input of the AND gate 84 receives a clock edge signal 82 from an edge detector (not shown) which detects the rising edge of the clock signal 34. Similarly, a data-triggered oscillator 90 comprises an AND gate 94 feeding into an XOR gate 96 whose output is fed back to a first input of the AND gate 94. A second input of the AND gate 94 receives a data edge signal 92 from an edge detector (riot shown) which detects the rising edge of the data signal 32. By design, each oscillator circuit 80, 90 is enabled on a logical '1'. Note that $\tau_f$ and $\tau_s$ are the respective propagation delays around the loop of each oscillator circuit 80, 90.

Figure 5:
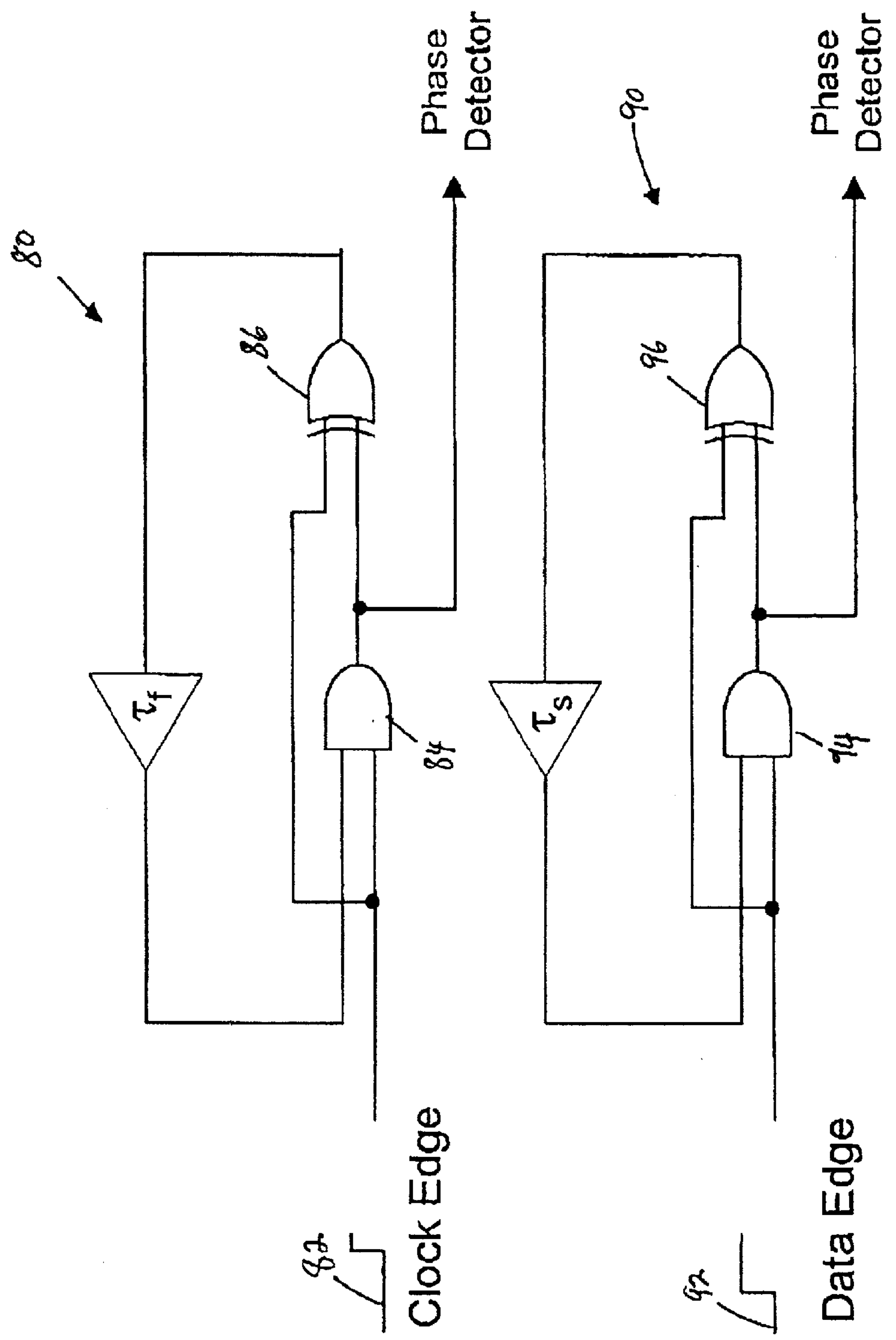
FIG. 5 shows ring oscillators which may be used in accordance with the present invention.

As shown in FIG. 5, the output of each oscillator circuit 80, 90 is delivered to a phase detector (not shown). The output of the oscillator circuit 80 may be referred to as a clock-triggered oscillation signal 88 while the output of the oscillator circuit 90 may be referred to as a data-triggered oscillation signal 98. In order to maintain a predictable phase relationship for detection, $\tau_s$ is set to be greater than $\tau_f$. (Here the subscript 's' indicates a slow oscillation and 'f' indicates a fast oscillation). This, in turn, establishes the oscillator circuit 80 triggered by the clock edge signal 82 (i.e. the clock-triggered oscillation signal 88) to run at a higher frequency than the oscillator circuit 90 triggered by the data edge signal 92 (i.e. the data-triggered oscillation signal 98).

Figure 6A:
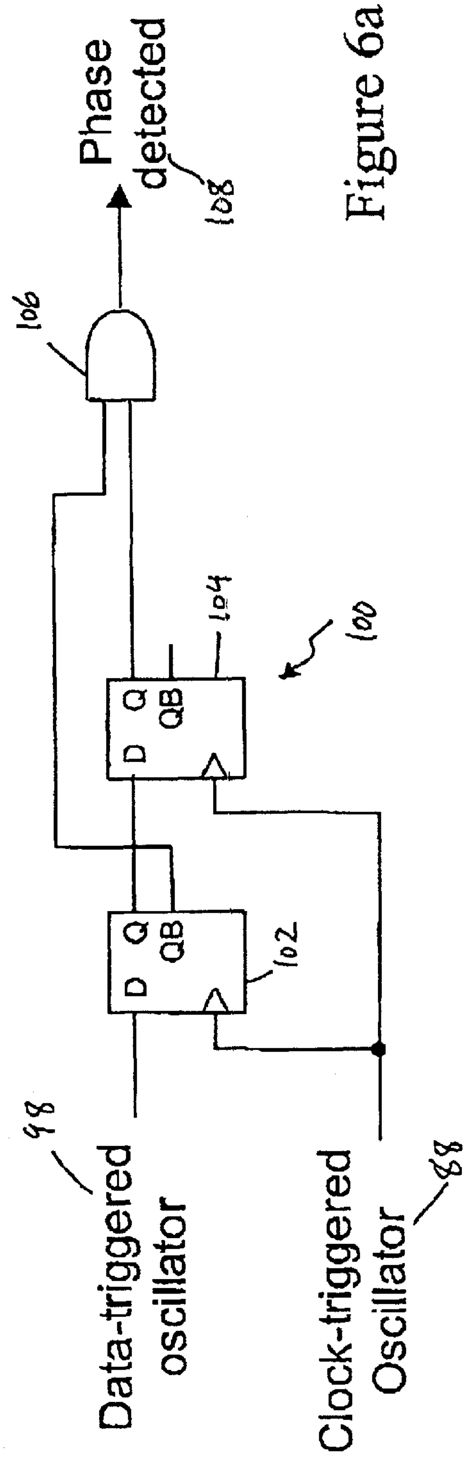
FIG. 6*a* shows a phase detector implementation which may be used in accordance with the present invention.

FIG. 6*a* shows a typical phase detector circuit 100 which may be used in an implementation of the present invention. The phase detector circuit 100 is implemented using a first D-latch 102, a second D-latch 104 and an AND gate 106. The D-input of the first D-latch 102 receives the data-triggered oscillation signal 98. The Q output of the first D-latch 102 is passed to the D-input of the second D-latch 104 while the QB(complementary) output is fed in as a first input to the AND gate 106. The Q output of the second D-latch 104 serves as a second input to the AND gate 106. The clock input of each D-latch 102, 104 receives the clock-triggered oscillation signal 88.

By design, the edge of the data-triggered oscillation signal 98 can always be set to lead the edge of the clock-triggered oscillation signal 88 at the start of the measurement process (using, for example, a buffer such as buffer 36 in FIG. 3). A phase detector circuit as that depicted in FIG. 6*a* may then be used to detect the history of the phase difference between the two oscillation signals 88, 98, thereby providing information on a change of phase. As mentioned before, a change of phase will be defined as the instant when the data-triggered oscillation signal 98 begins to lag the clock-triggered oscillation signal 88. When this occurs, the measurement process is to stop as described below.

Figure 6B:
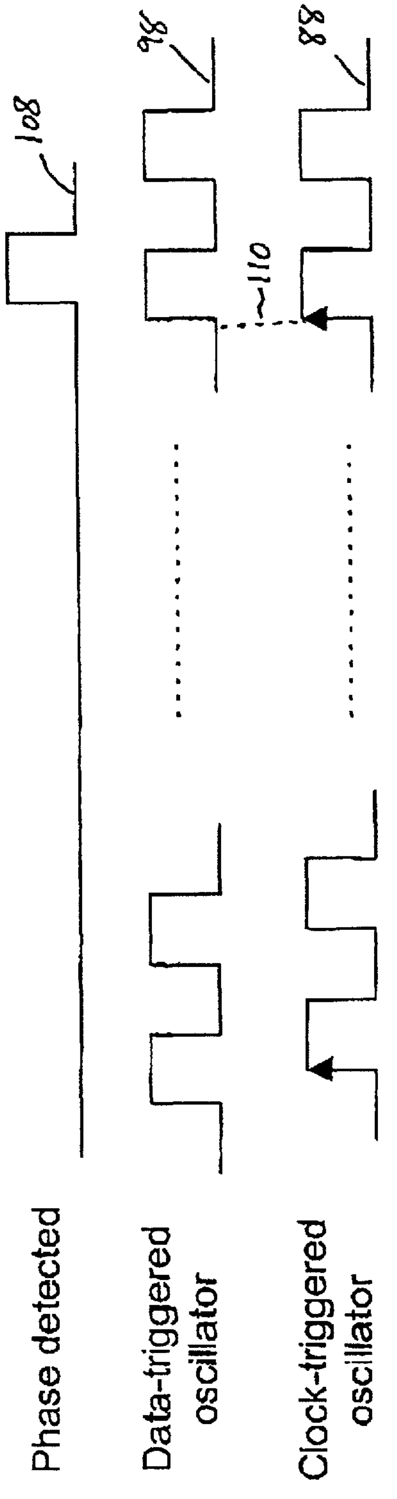
FIG. 6*b* shows the timing behavior of the phase detector implementation in FIG. 6*a*.

FIG. 6*b* is a timing diagram clarifying the operation of the phase detector 100 in FIG. 6*a*. As mentioned, the data-triggered oscillation signal 98 is always set to lead the clock-triggered oscillation signal 88 at the start of the measurement process. As a result, at the start of the measurement process, the first D-latch 102 will begin by registering a logical '1' corresponding to the logical '1' value of the data-triggered oscillation signal 98 at the first rising edge of the clock-triggered oscillation signal 88. It is obvious that after each cycle of the clock-triggered oscillation signal 88, the rising edge of the clock-triggered oscillation signal 88 will move towards to the rising edge of the data-triggered oscillation signal 98 by the amount $\Delta T$ where $\Delta T = T_s - T_f$, where $T_s$ is the oscillation period of the data-triggered oscillator 90 and $T_f$ is the oscillation period of the clock-triggered oscillator 80.

The data-triggered oscillation signal 98 will continue to lead the clock-triggered oscillation signal 88 until a point in time is reached when the rising edge of the clock-triggered oscillator signal 88 corresponds to a logical '0' of the data-triggered oscillator signal 98. In FIG. 6*b*, this point in time is marked at dashed line 110. At this instant, the data-triggered oscillation signal 98 begins to lag with respect to the clock-triggered oscillation signal 88, thereby signifying a change of phase. The role of the phase detector 100 is to detect this change of phase in the form of a phase detected output signal 108. Specifically, when an input sequence of '10' is registered by the first D-latch 102, the output of the AND gate 106 in FIG. 6*a* will switch from logical '0' to '1' to produce the phase detected output 108 as shown in FIG. 6*b*.

Figure 7:
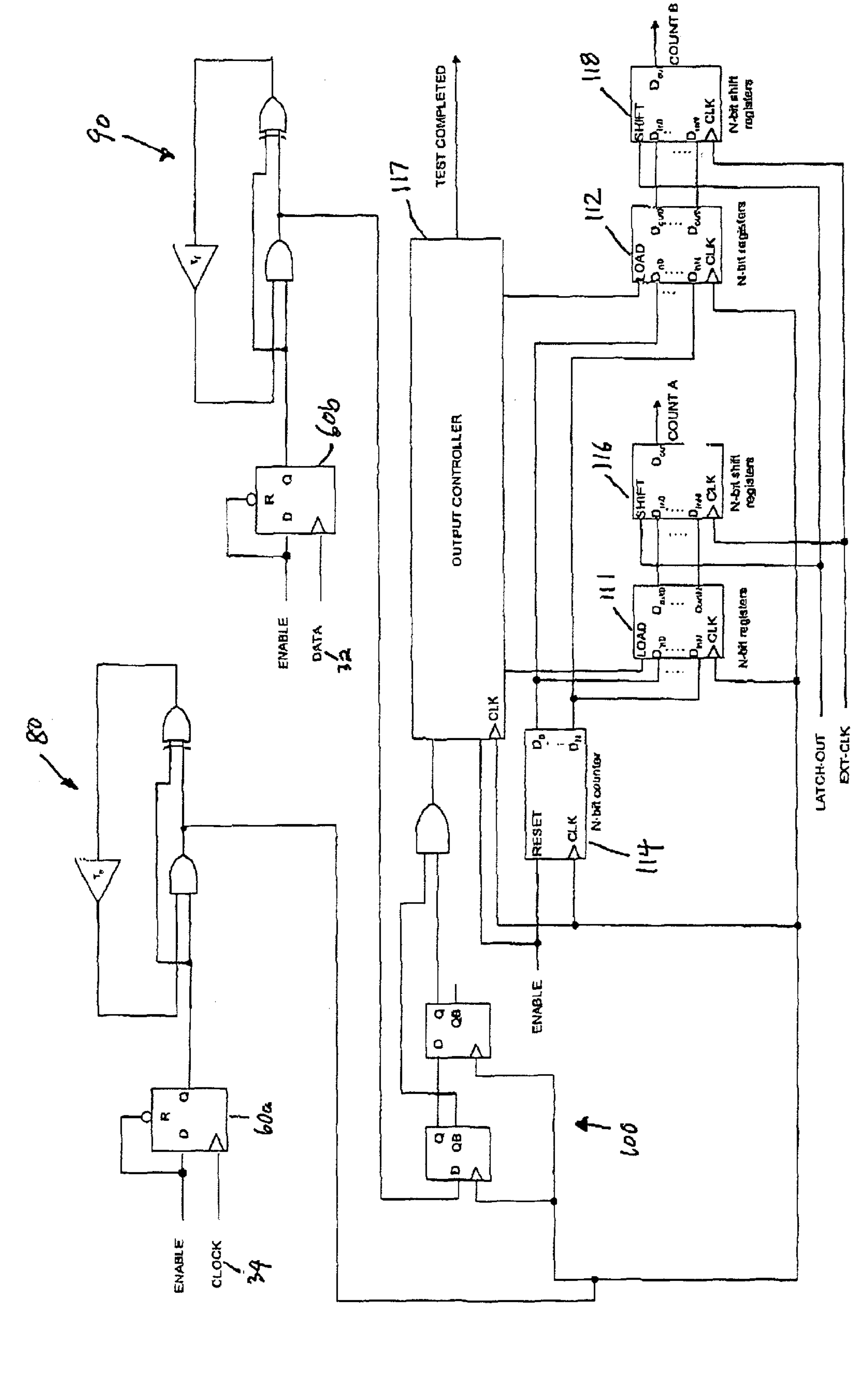
FIG. 7 shows a circuit diagram for an example embodiment of the present invention.

The circuitry in FIGS. 4*a*, 5 and 6*a* may be combined to provide a full circuit implementation of an embodiment of the present invention as shown in FIG. 7. Here, a first edge detector 60*a* receives the CLOCK signal 34 and triggers the clock-triggered oscillator 80 to generate a corresponding clock-triggered oscillation signal. Similarly, a second edge detector 60*b* receives the DATA signal 34 and triggers the data-triggered oscillator 90 to generate a data-triggered oscillation signal. The outputs of the oscillator circuits 80, 90 are connected to a phase detector 100 in the same way as shown in FIG. 6*a*. As seen, circuit blocks 60, 80, 90 and 100 in FIG. 7 are identical two the circuitry detailed in FIGS. 4*a*, 5 and 6*a*. The output of the clock-triggered oscillator 80 is also used to clock an N-bit counter 114. The N-bit counter 114 is used to count the number of clock-triggered oscillator cycles before detection of a change of phase in both calibration and measurement modes as will be discussed later. The output of the phase detector 100 is fed into an output controller 117 which is adapted to control the N-bit counter 114 and loading of two N-bit registers 111, 112. The N-bit registers 111, 112 are loaded with output values of the N-bit counter 114 under the control of the output controller 106. Finally, the outputs of the two N-bit registers 111, 112 are fed to corresponding N-bit shift registers 116, 118 in a parallel fashion. The values stored in each N-bit shift register may then be latched out to a programmed processor for generation of a respective histogram of jitter. It is a relatively straightforward matter to process the resulting histogram to extract the peak to peak and rms values of the time jitter associated with the data signal 32.

Those skilled in the art will appreciate that an intrinsic delay difference will exist between the signal path of the data signal 32 and the signal path of the clock signal 34 before triggering respective oscillator circuits 80, 90. This delay difference will include, for example, the intentional delay added between the clock-triggered ring oscillator 80 and the clock edge detector 60*b* (not shown), the setup time and propagation delay difference between the D-Latches in the two edge detectors 60*a*, 60*b* as well as that of the "XOR" gates in the two switched oscillators 80, 90. Since all these delays are process sensitive, the measured delay will be different from the actual delay difference between the clock and the data edges.

It should also be noted that the difference in oscillation frequencies between the data-triggered oscillation signal and the clock-triggered oscillation signal determines the measurement resolution, which also becomes process sensitive due to the unpredictable delay of the loop in each oscillator 80, 90. Therefore, in order to make the design fully synthesizable, i.e. no element matching required, a calibration sequence is necessary to determine the frequency of each oscillation signal and the difference between the delay paths of the data 32 and clock signal 34. The nature of such a calibration sequence will now be discussed with reference to FIG. 8*a* which is a sample timing diagram illustrating the timing relationships between the phase detector 100, the data-triggered oscillator 90 and the clock-triggered oscillator 80 during calibration mode.

In calibration mode, the CLOCK and DATA lines 32, 34 are first tied together to determine the intrinsic delay difference between the two signal paths. This may be accomplished, for example, using a switching block implemented in CMOS technology which controllably connects the clock signal 34 (reference signal) to the clock input of D-latch 60*b* when calibration is to be performed. In calibration, then, the same reference or input calibration signal is used to trigger each respective oscillator 80, 90. Because these two inputs are tied together, jitter on the input calibration signal will not be important. The, the delay difference between the two signal paths is recorded as the number of clock-triggered oscillator cycles, i.e. $N_o$ counts, prior to detection of a first change of phase 120. This number of clock-triggered oscillator cycles, $N_o$, may be recorded by a counter and then passed to a register for temporary storage.

Figure 8A:
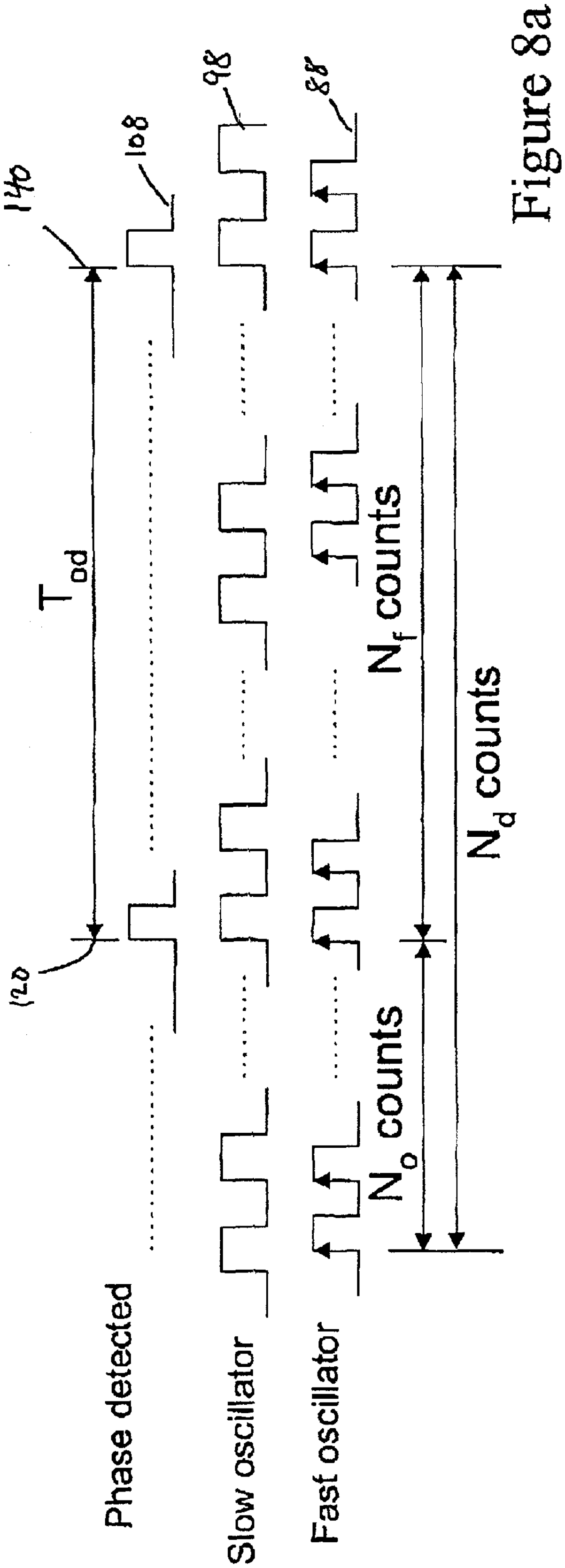
FIG. 8*a* shows the timing relationship between the ring oscillators and corresponding response of the phase detector during calibration mode.

Note that a change of phase is defined as the time when the data-triggered oscillation signal 98 goes from a leading to lagging relationship with respect to the clock-triggered oscillation signal 88. As mentioned, after each oscillation period, $T_f$, of the clock-triggered oscillation signal 88, the clock-triggered oscillation signal 88 advances towards the data-triggered oscillation signal 98 by the difference delay:

$$\Delta T = T_s - T_f \tag{1}$$

where $T_s$ is the oscillation period of the data-triggered oscillation signal 98. As seen in FIG. 8*a*, after a certain period of time, $T_{od}$, the clock-triggered oscillation signal 88 will move across one complete cycle of the data-triggered oscillation signal 98 and in so doing, a second phase change 140 will be detected. The corresponding number of cycles of the clock-triggered oscillation signal from triggering to detection of this second change of phase 140 may be recorded as $N_d$ counts, leading to the result:

$$N_f = N_d - N_o \tag{2}$$

where $N_f$ is the number of clock-triggered oscillator cycles over the range $T_{od}$. Clearly, the number of clock-triggered oscillation cycles, $N_d$, prior to detection of a second change of phase may be recorded by the same counter as before. In this case, the number of counts $N_o$ recorded by the counter are passed out to a first register at detection of a first change of phase while the counter continues counting to record $N_d$ counts of the clock-triggered oscillator until a second change of phase is detected. The number of clock-triggered oscillator cycles, $N_d$, recorded at the second change of phase may then passed to a second register for temporary storage and calculation purposes.

The count values $N_o$, $N_d$ stored in the registers during calibration may then be latched out to a programmed processor adapted to carry out various calculations. For example, the period of the clock-triggered oscillator, $T_f$, can then be determined from a time measurement of $T_{od}$ and the register values as follows:

$$T_f = \frac{T_{od}}{N_f} = \frac{T_{od}}{N_d - N_o} \tag{3}$$

As the clock-triggered oscillator completes $N_f$ cycles in the time interval $T_{od}$, the data-triggered oscillator must complete $(N_f-1)$ cycles. Hence, $$T_{od} = N_f \cdot T_f = (N_f - 1) \cdot T_s \tag{4}$$

Rearranging equation (4), the period of the data-triggered oscillator, $T_s$, may then be determined as:

$$T_s = T_f \frac{N_f}{Nf - 1} = \frac{T_{od}}{N_f - 1} \tag{5}$$

The time value of $T_{od}$ is usually very large compared to $T_f$. Thus, depending on measurement equipment, an accurate measure of $T_{od}$ may not be easily obtainable, especially in the case of a small time step over a large measurement range. An alternative approach is to measure $T_f$ indirectly using the counter output. As described previously, the counter is used to count the number of clock-triggered oscillator cycles during calibration as well as during measurement mode. Therefore, when the clock-triggered oscillator is running, $T_f$ can be obtained by measuring the cycling time of one bit of the counter. In this case, $T_f$ can be defined as follows:

$$T_f = \left(\frac{1}{2}\right)^n \times T_c \tag{6}$$

where n is the bit position with respect to the least significant bit of the counter and $T_c$ is the cycling time of the nth counter bit. Therefore, substituting equation (6) into equation (3) and rearranging yields the following expression for $T_{od}$:

$$T_{od} = T_f \times N_f = \left(\frac{1}{2}\right)^n \times T_c \times N_f \tag{7}$$

The oscillation period of the data-triggered oscillator, $T_s$, may then be calculated using equation (5)

Figure 8B:
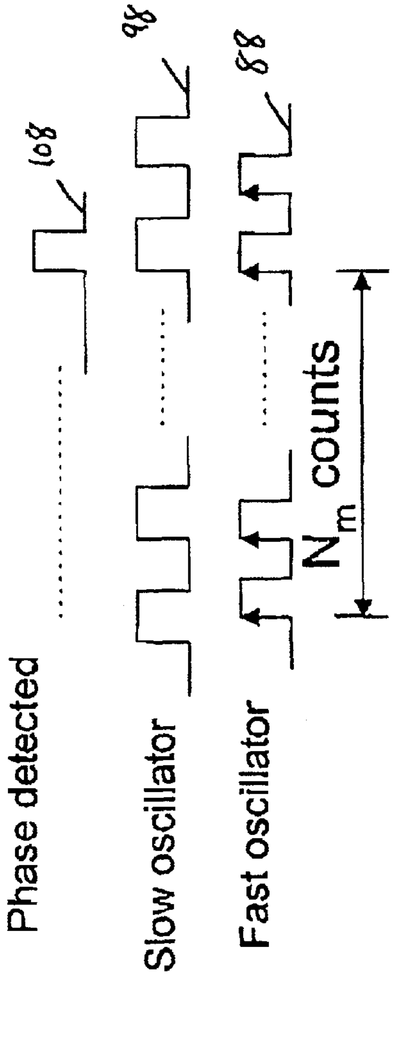
FIG. 8*b* shows the timing relationship between the ring oscillators and corresponding response of the phase detector during measurement mode.

Since the measurement and calibration modes will experience the same delay difference between the clock and data signal paths, the time difference between the rising edges of the data and clock signals (i.e. jitter) may be computed in a straightforward manner. In this regard, FIG. 8*b* is a timing diagram illustrating sample timing relationships between the phase detected output signal 108, the data-triggered oscillation signal 98 and the clock-triggered oscillation signal 88 during measurement mode. As before, the data-triggered oscillation signal 98 is set to lead the clock-triggered oscillation signal 88 by design. A count of the number of cycles of the clock-triggered oscillation signal 88 from triggering until a first occurrence of a phase change is recorded as $N_m$ counts by the counter. Assuming, then, that the counter output during measurement mode is $N_m$ as shown in FIG. 8*b*, the time difference between the data and clock rising edges may be computed as follows:

$$T_m = \Delta T (N_m - N_o) \tag{8}$$

where $\Delta T = T_s - T_f$, and $N_o$ is the number of counts recorded in calibration mode (and stored in a register) for the delay difference in signal paths between the clock and data signals.

Those skilled in the art will appreciate that in terms of an on-chip implementation of the present invention, a mode select pin on the chip may be used to toggle between a calibration and a measurement mode. In a simple example, a logical '1' presented on the mode select pin may render the system into calibration mode while a logical '0' may render the system into measurement mode. In calibration mode, the clock and data lines may be tied together using a suitable switching block and an output controller may be used to control the loading of various registers with count values $N_m$, $N_d$ recorded by the counter at first and second instances of a change in phase. In measurement mode, then, the switching block will pass the data signal of interest to its respective oscillator in order that jitter measurements may be made. In this mode, the output controller will control the loading of a register with the appropriate count value $N_m$ from the counter. In both calibration and measurement modes, the values of interest recorded by the counter and stored in the registers may be passed to a programmed processor to carry out the necessary calculations defined by the preceding equations.

It is well known that test time is an important criteria when quantifying the performance of a measurement device. Accordingly, the required test time of the component-invariant VDL of the present invention will now be compared with that of a full VDL.

For a full VDL, the required test time, $T_{test}$, to collect all the CDF data will be roughly equal to:

$$T_{test} \approx T_{clk} \times N_{sample} + \Delta\tau \times N_{stage} \tag{9}$$

where $T_{clk}$ is the clock period, $N_{sample}$ is the number of samples taken, $\Delta\tau$ is the time resolution of the complete VDL and $N_{stage}$ is the number of stages used in the VDL. For example, using a clock frequency $T_{clk}$=1 ns and assuming the number of samples to be collected is $N_{sample}$=5000 with a resolution of $\tau_s$=1 ps and a measurement range of 0.5 ns (i.e. half of the clock period), the number of stages needed is $N_{stage}$=500. Then, using equation (9), the required test time, $T_{test}$, will be approximately 2.5 μs.

For the component-invariant VDL structure of the present invention, assuming jitter is uncorrelated with the clock signal, the average test time can be estimated by taking the mean of the respective maximum and minimum test times per sample. It is obvious that the test time per sample will be at a maximum when the clock-triggered oscillation signal and the data-triggered oscillation signal differ by almost one full clock-triggered oscillation cycle, $T_f$. Similarly, the test time per sample will be at a minimum when the data-triggered oscillation signal and the clock-triggered oscillation signal are aligned such that it only requires one clock-triggered oscillation cycle to obtain a phase change. Accordingly, the maximum test time can be estimated to be:

$$T_{test} = T_f \frac{Y_s}{\Delta T} \tag{10}$$

where $T_{test}$ is the test time, $T_s$ is the period of the data-triggered oscillation signal, $T_f$ is the period of the clock-triggered oscillation signal and $\Delta T$ is the time resolution of the component invariant VDL. Since $T_f \approx T_s$, the maximum test time can be simplified to:

$$T_{test} \approx \frac{T_f^2}{\Delta T} \tag{11}$$

Therefore, the average test time per sample is:

$$T_{test} \approx \frac{T_f^2}{2\Delta T} \tag{12}$$

For an oscillation period of $T_f$=0.5 ns (i.e. measurement range of 0.5 ns) and the number of samples to be collected being $N_{sample}$=5000 with a resolution of $\Delta T$=1 ps, a rather large test time of $T_{test}\approx$1.25 ms is required. Therefore, the single component-invariant VDL approach of the present invention clearly leads to longer test times when compared to the full VDL approach. However, as will be seen, one way to reduce the test time using the component-invariant VDL approach of the present invention is to incorporate additional component-invariant VDL stages.

Figure 9:
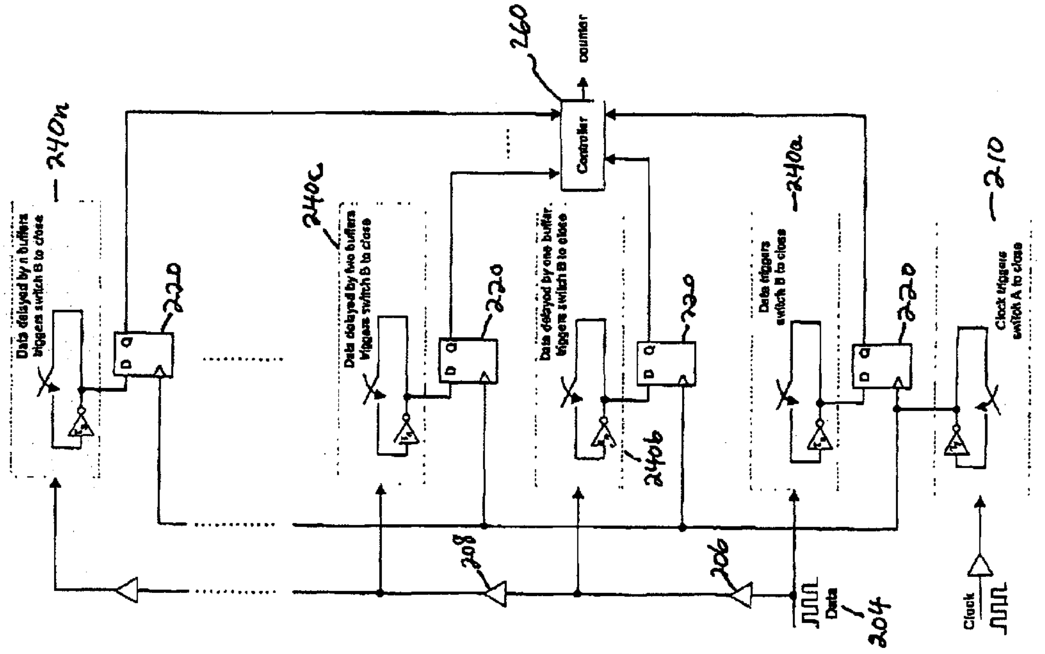
FIG. 9 shows an array of component-invariant VDL structures which may be used in accordance with the present invention.

FIG. 9 depicts an arrayed configuration of component-invariant VDLs according to a further aspect of the present invention, Here, a single clock-triggered oscillator 210 is shown driving the clock input of each of a plurality of D flip-flops 220. A plurality of data-triggered oscillators 240 provide the corresponding D-inputs to each of the plurality of D flip-flops 220. All data-triggered oscillators 240 are designed to have the same nominal oscillation frequency but all are triggered by a progressively increasing one-gate delayed data signal 204. For example, a first data-triggered oscillator 240*a* in the array is triggered by the data signal 204 without any delay while a second data-triggered oscillator 240*b* is triggered by the data signal 204 after it passes through a first gate delay 206. Similarly, a third data-triggered oscillator 240*c* is triggered by the data-signal 204 after it passes through the first gate delay 206 and a second gate delay 208 and so on and so forth. The output of each D flip-flop 220 is then fed to a controller 260 which contains the necessary hardware (not shown) to detect phase changes between each of the data-triggered oscillation signals and the clock-triggered oscillation signal.

Figure 10:
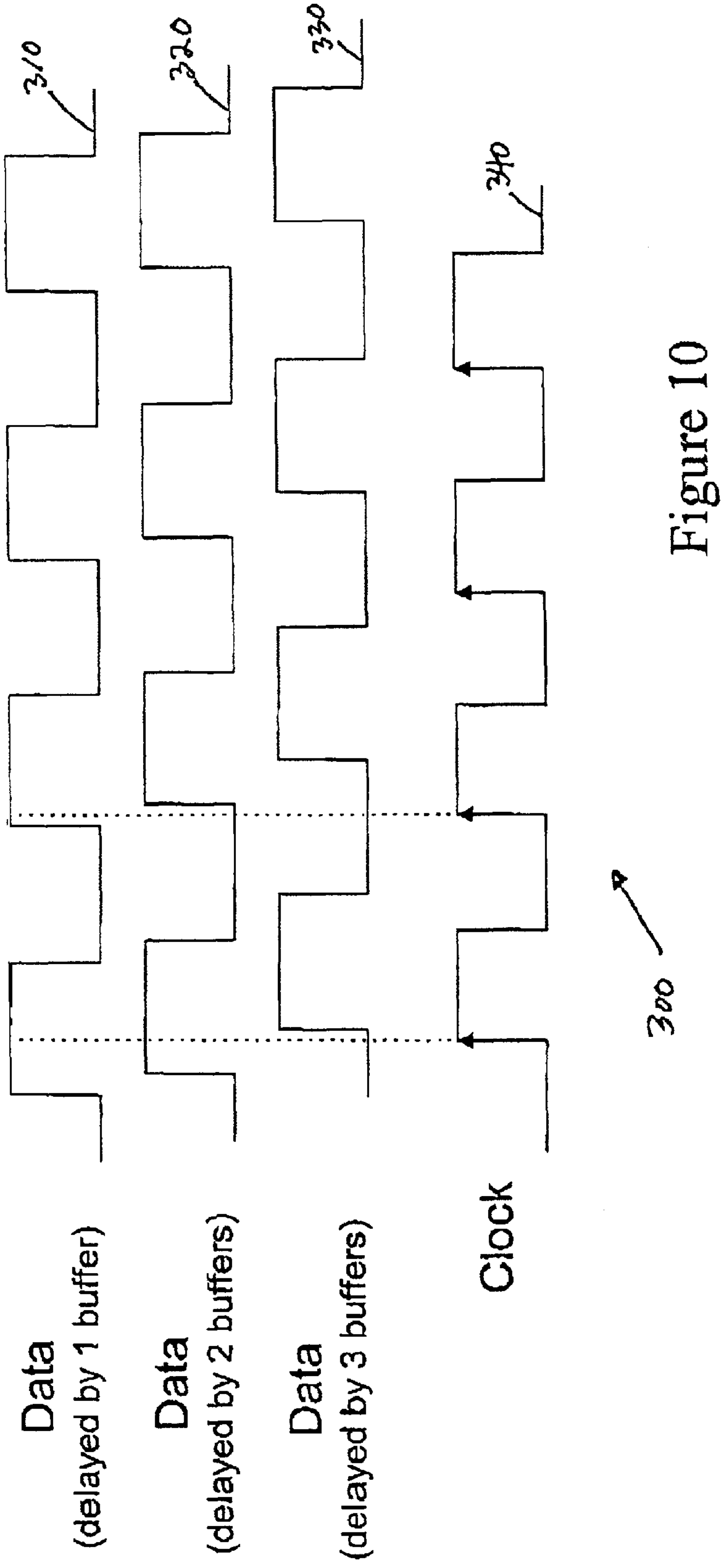
FIG. 10 shows an example timing relationship between the individual VDLs of the VDL array structure of FIG. 9.

With the data-triggered oscillation frequency set below the clock-triggered oscillation frequency, a time-grid 300 of data-triggered oscillation signals will result as shown in FIG. 10. In this figure, a clock-triggered oscillation signal 340 is shown along with three data-triggered oscillation signals. Here, for example, a first data-triggered oscillation signal 310 may correspond to the case where a data signal is delayed by one buffer, a second data-triggered oscillation signal 320 may correspond to the case where the data signal is delayed by two buffers and a third data-triggered oscillation signal 330 may correspond to the case where the data signal is delayed by three buffers. In a similar manner to the single component-invariant VDL structure of FIG. 7, as soon as the rising edge of the clock-triggered oscillation signal 340 passes through any one of the rising edges of the data-triggered oscillation signals 310, 320 and 330, a phase change will have occurred and can, likewise, be detected. In the example of FIG. 10, it is readily seen that the second data-triggered oscillation signal 320 leads to detection of this first occurrence of a phase change.

For jitter measurement applications, the arrayed structure of FIG. 9 has the advantage that the measurement time is significantly reduced. Since jitter is assumed to be random and, hence, does not correlate with the time at which the sample is taken, a non-uniform sampling of data will also lead to a good estimation of the jitter statistics.

Phase differences between any of the data-triggered oscillators do not have to be matched, since calibration can be performed separately on each component-invariant VDL circuit. For the same reasons, the frequencies of oscillation for each of these data-triggered oscillators do not, likewise, have to be exactly equal.

Figure 11:
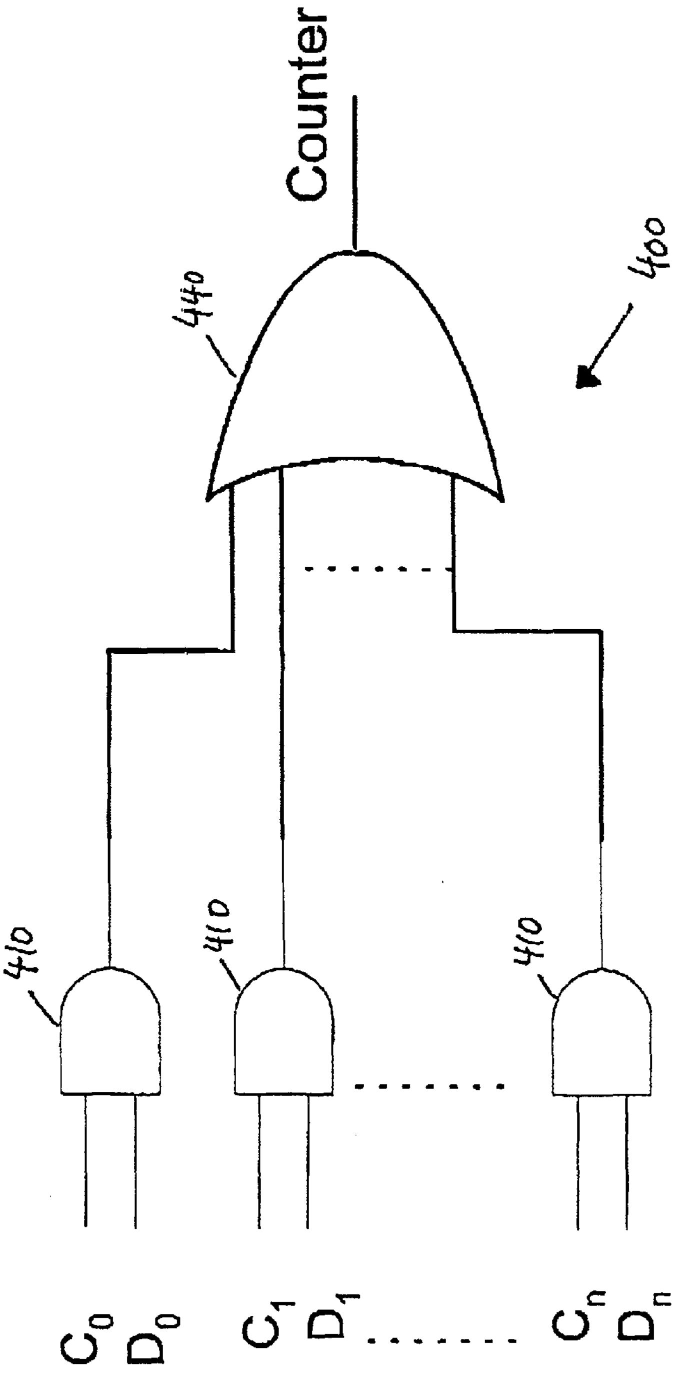
FIG. 11 shows an example of a controller which may be used in conjunction with the VDL array structure of FIG. 9.

However, since more than one phase detector is necessary, a controller will be required to identify the earliest detection of a change of phase. In this regard, FIG. 11 depicts some very simple combination logic 400 which may be used to identify a first occurrence of a change of phase. Each phase detector in an arrayed VDL structure as shown in FIG. 9 may take the form of the phase detector circuitry shown in FIG. 6*a*. Accordingly, in FIG. 11, a series of AND gates 410, one for each phase detector, are shown and correspond to the AND gate 106 of the phase detector depicted in FIG. 6*a*. Each AND gate output then serves as an input to an OR gate 440 whose output feeds into a counter (not shown). As in FIG. 6*a*, for a change of phase to be detected both inputs, $C_n$ and $D_n$, to a particular AND gate will have to be logical '1'. Specifically, the output of a particular AND gate will switch from logical '0' to logical '1' when an input sequence of "10" to its respective phase detector circuitry is detected. Thus, when this occurs, one of the inputs of the OR gate 440 will be logical '1' causing the output of the OR gate to switch from logical '0' to logical '1'. The output of the OR gate 440 is fed to the counter to stop the measurement process.

The calibration process for the arrayed component-invariant VDL will be exactly the same as that described for the single component-invariant VDL structure (FIG. 7), provided one calibrates each data-triggered oscillator separately with respect to the clock-triggered oscillator. For example, during calibration mode, a control signal $C_i$ of the $i^{th}$ data-triggered oscillator should be set to a logical '1' to enable the $i^{th}$ data-triggered oscillator. At this time, all other control signals, $C_j$ (i≠j), should be set to a logical '0' to disable the other data-triggered oscillators. During measurement mode, all control signals, $C_{i,j}$, should be set to logical '1'.

Since the efficiency of the test time reduction depends on the time-grid location, if N component-invariant VDLs are added to the array to provide an optimal time-grid, the average test time per sample is reduced to:

$$T_{test} \approx \frac{T_f^2}{2N \times \Delta T} \tag{13}$$

where $T_{test}$ is the test time per sample, $T_f$ is the period of the clock-triggered oscillator, ΔT is the time resolution of the component-invariant VDL and N is the number of data-triggered oscillators.

It will be appreciated that an "OR" gate with a large number of inputs will be required if many data-triggered oscillators are employed in the design. However, since the test time is reduced by a factor of N, if N oscillators are added to the array, only a few data-triggered oscillators are required to produce a "time grid" fine enough to reduce the test time significantly. Note also that the circuit for an arrayed VDL configuration must be capable of identifying which particular data-triggered oscillator led to detection of a first occurrence of a phase change. This can easily be obtained by feeding the output of each phase detector circuit into the counter as additional most significant bits. In other words, the most significant bits of the counter will then contain enough information to identify which data-triggered oscillator corresponds to first detection of a change of phase.

As an example implementation, a three oscillator structure (i.e. one clock-triggered oscillator and two data-triggered oscillators) was implemented on an Altera FPGA. The whole design fit onto a 128 macrocell FPGA. The oscillation frequency of the clock-triggered oscillator was found to be 1.23 MHz, corresponding to a period of 81.6 ns. The oscillation period of the two data-triggered oscillators were found to be 81.03 ns and 80.38 ns. This gave rise to a timing resolution of 0.566 ns in one case, and 1.22 ns, in the other. It should be noted that these particular results are strongly dependent on the physical location of the macrocell in the FPGA. That is, if one were to exercise greater control over the cell placement, a higher timing resolution would be expected.

Figure 12A:
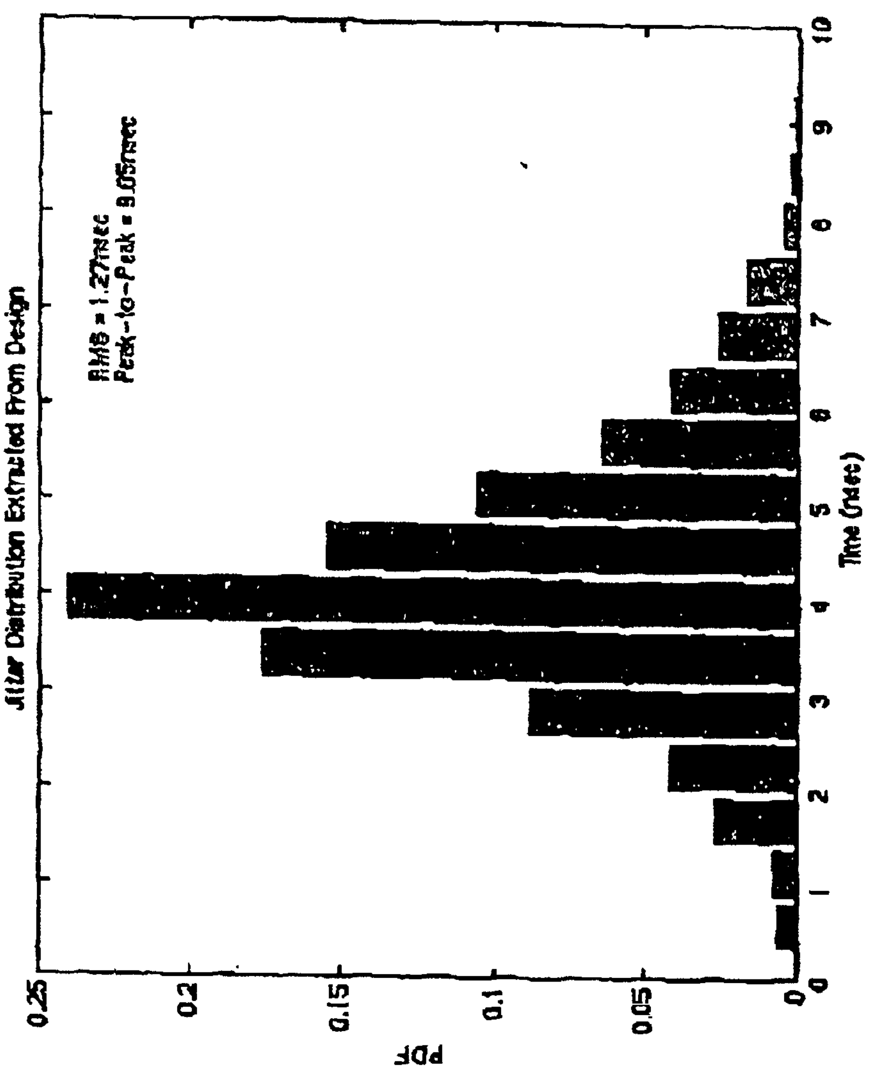
FIG. 12*a* shows a measured histogram using the VDL of the present invention arranged to have a timing resolution of 0.566 ns.

To test the above circuits, a Teradyne A567 tester was used to generate a 2 MHz repetitive data signal with a jitter component having Gaussian statistics. The jitter was designed to have zero mean, an RMS value of 1.03 ns and an 8 ns peak-to-peak value. The component-invariant VDL with a 0.566 ns timing resolution was then used to measure the characteristics of this signal with 1500 samples, the results of which are displayed in FIG. 12*a*. Here the RMS value was found to be 1.27 ns and the peak-to-peak value was found to be 9.05 ns. In the case of the RMS value, the experimental error was 0.24 ns which is within the timing resolution of the VDL, i.e. 0.566 ns.

Figure 12B:
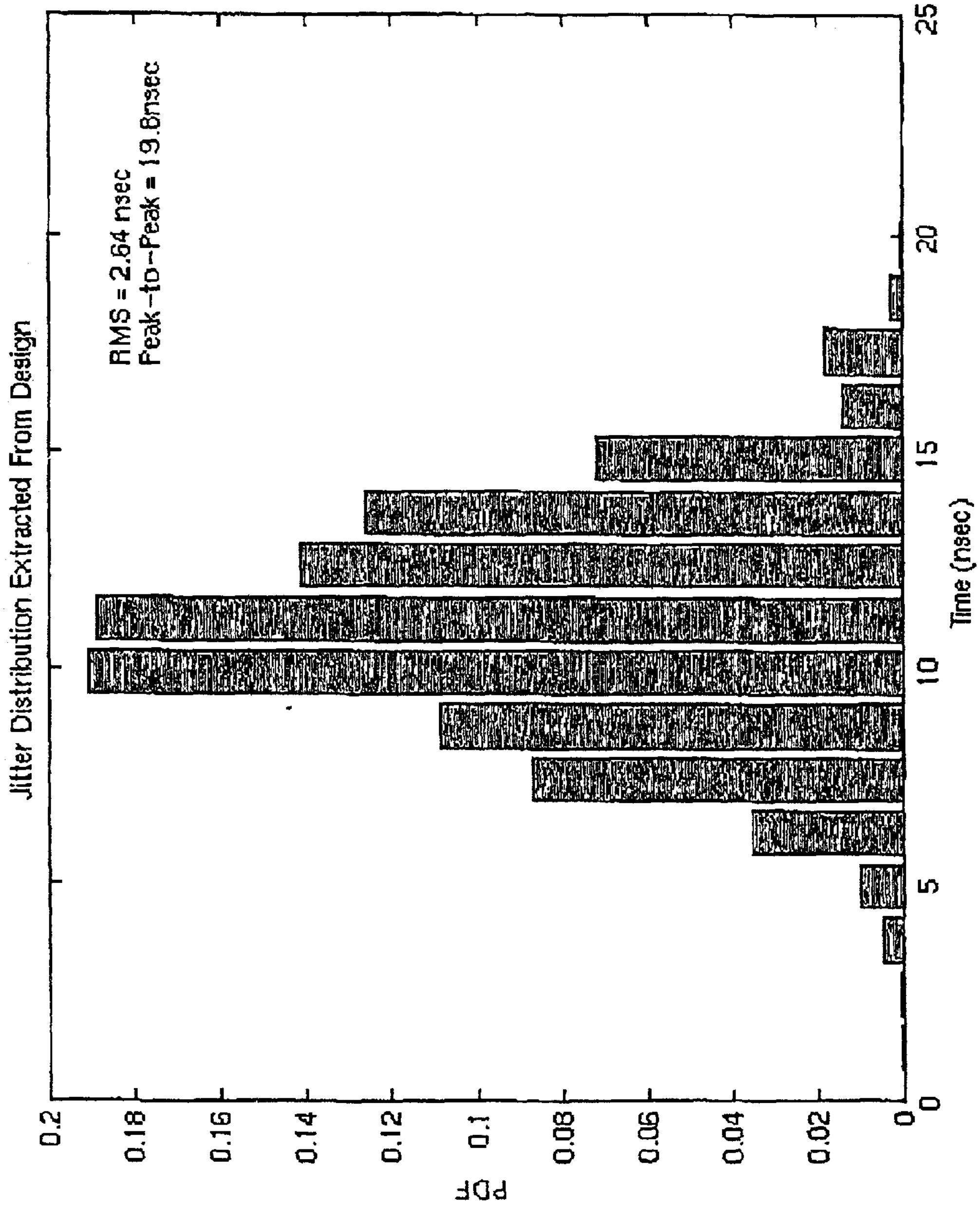
FIG. 12*b* shows a measured histogram using the VDL of the present invention arranged to have a timing resolution of 1.22 ns.
Figure 13:
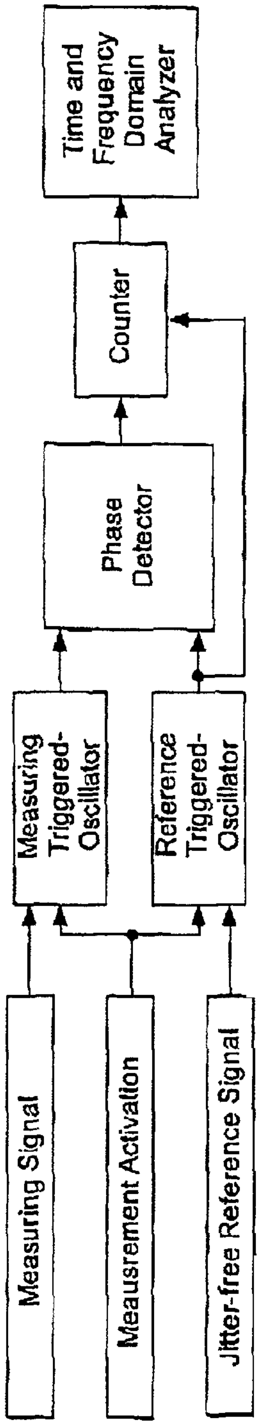
FIG. 13 shows a block diagram of a timing measurement system of the present invention.
Figure 14:
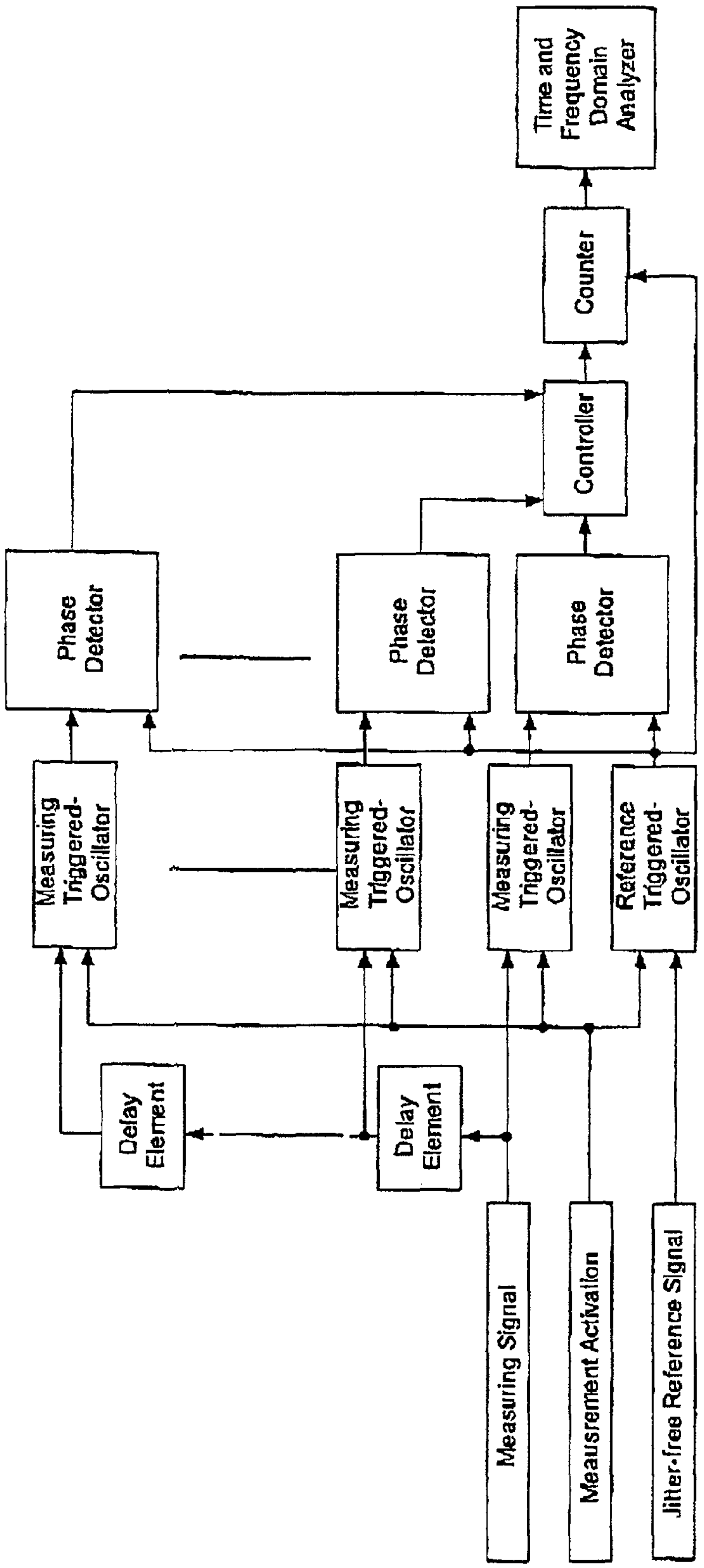
FIG. 14 shows a block diagram of one embodiment of a timing measurement system of the present invention that includes a test reduction feature.
Figure 15:
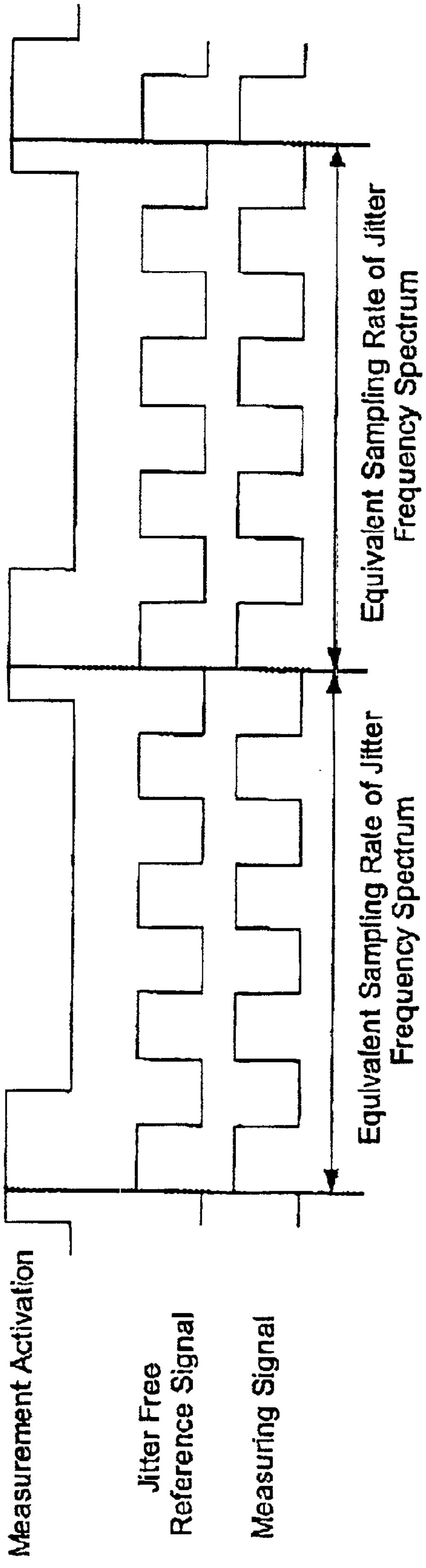
FIG. 15 shows a diagram illustrating an exemplary timing relationship among the measurement system of the present invention.

A second test was run using the component-invariant VDL that had a 1.22 ns timing resolution. In this case, the jitter was designed to have an RMS value of 2.06 ns and a 16 ns peak-to-peak value. The results gathered in this second case are shown in FIG. 12*b*, again using 1500 samples. The measured distribution has an RMS value of 2.64 ns and a 19.8 ns peak-to-peak value. In the case of the RMS value, the experimental error was 0.58 ns which is again within the timing resolution of the VDL, i.e. 1.22 ns.

To illustrate the test time reduction that is possible when an array of component-invariant VDL structures are utilized, Table 1 below summarizes the test time required for each of two VDLs tuned to 0.5466 ns and 1.22 ns timing resolution, and also for when both VDLs are utilized during the same timing measurement. As is clearly evident in the case cited, when the two VDLs are combined, a reduction in test time is achieved. Since the efficiency of the time reduction depends on the time grid location of the VDLs, if one were to exercise greater control over the cell placement, then a higher efficiency in test time reduction would be expected.

Table 1: Test Time Reduction
Peak-to-peak Jitter of 45 ns

| VDL Used | Test time |
|---|---|
| 0.566 ns-resolution VDL | 196635 clock cycles |
| 1.22 ns-resolution VDL | 96235 clock cycles |
| Both oscillators | 81960 clock cycles |

The component-invariant VDL circuit of the present invention was implemented in a 0.18 μm CMOS process. The expected time resolution was of the order of 10 ps. One component-invariant VDL occupied an area of 0.12 $mm^2$. Since the design is relatively small, it is believed that numerous jitter measurement test cores can be constructed and placed on the same die.

To conclude, in recent years, much effort has been placed on improving the performance of timing and jitter measurement devices using Delay Locked Loop (DLL) and Vernier Delay Line (VDL) techniques, However, these approaches require highly matched elements in order to reduce differential non-linearity timing errors. In an attempt to reduce the requirement on element matching, the component-invariant VDL technique of the present invention enables the measurement device to he synthesized from an RTL description. Furthermore, the method of the present invention also reduces test time at the expense of more hardware, as test time is an important consideration during a production test.

The embodiment(s) of the invention described above is(are) intended to be exemplary only. The scope of the invention is therefore intended to be limited solely by the scope of the appended claims.

We claim:

1. A method for measuring a time difference between a first event and a second event, comprising the steps of:

triggering a first oscillator circuit to generate a first oscillation signal with an oscillation period $T_s$ upon detection of said first event;

triggering a second oscillator circuit to generate a second oscillation signal with an oscillation period $T_f$ upon detection of said second event, wherein $T_s$ is not equal to $T_f$ and wherein a difference, ΔT, between $T_s$ and $T_f$ is small with respect to either of $T_s$ and $T_f$;

detecting a change of phase between said first and second oscillation signals; and determining a time difference between said first and said second events from said difference, ΔT, between $T_s$ and $T_f$ and a count of a number of cycles, $N_m$, of only one of said first oscillator circuit and said second oscillator circuit at which said detected change of phase occurs.

2. A method as claimed in claim 1, wherein said step of detecting a change of phase comprises a step of measuring a phase difference between said first and second oscillation signals.

3. A method as claimed in claim 2, wherein said step of detecting a change of phase further comprises a step of determining when a relative position of said first oscillation signal goes from a leading to a lagging relationship with respect to said second oscillation signal.

4. A method as claimed in claim 1, wherein said first oscillator circuit comprises a ring oscillator circuit comprising a first inverter with a propagation delay of $\tau_s$, an output of said first inverter being connected into an input of said first inverter using a first switch and wherein said first switch is closed upon detection of said first event.

5. A method as claimed in claim 4, wherein said second oscillator circuit comprises a ring oscillator circuit comprising a second inverter with a propagation delay of $\tau_f$, an output of said second inverter being connected into art input of said second inverter using a second switch and wherein said second switch is closed upon detection of said second event.

6. A method as claimed in claim 5 wherein $\tau_s$ is greater than $\tau_f$ and wherein a difference between $\tau_s$ and $\tau_f$ is small with respect to either of $\tau_s$ and $\tau_f$.

7. A method as claimed in claim 1 further comprising a step of performing a calibration sequence prior to measuring the time difference between said first and second events, said calibration sequence providing a measure of the oscillation period $T_s$ of said first oscillation signal, the oscillation period $T_f$ of said second oscillation signal and a measure of an intrinsic delay difference between said first and second events.

8. A method as claimed in claim 7 wherein the step of performing a calibration sequence comprises the steps of:

triggering each of said first and second oscillator circuits upon detection of said second event to generate respective first and second oscillation signals having respective oscillation periods $T_s$ and $T_f$, wherein $T_s$ is greater than $T_f$ and wherein a difference, $\Delta T$, between $T_s$ and $T_f$ is small with respect to either $T_s$ and $T_f$;

counting a number of cycles, $N_o$, of said second oscillator circuit until a first change of phase is detected between said first and second oscillation signals, said first phase change being the first occurrence when a relative position of said first oscillation signal goes from a leading to lagging relationship with respect to said second oscillation signal;

counting a number of cycles, $N_o$, of said second oscillator circuit until a subsequent change or phase is detected between said first and second oscillation signals, said subsequent change of phase being the second occurrence when a relative position of said first oscillation signal goes from a leading to a lagging relationship with respect to said second oscillation signal; and measuring a period of time, $T_{od}$, from said first detected change of phase to said subsequent detected change of phase.

9. A method as claimed in claim 8 wherein the oscillation period $T_f$ of the second oscillation signal is determined according to:

$$T_f = \frac{T_{od}}{N_f} = \frac{T_{od}}{N_d - N_o}.$$

10. A method as claimed in claim 8 wherein the oscillation period $T_s$ of the first oscillation signal is determined according to:

$$T_s = T_f \frac{N_f}{Nf - 1} = \frac{T_{od}}{N_f - 1}.$$

11. A method as claimed in claim 8 wherein the time difference, $T_m$, between said first and second events is determined according to:

$$T_m = \Delta T(N_m - N_o).$$

12. A method as claimed in claim 1, wherein said first event is a rising edge of a data signal and said second event is a rising edge of a clock signal and wherein said time difference is a value of jitter.

13. A method as claimed in claim 12, further comprising repeating all steps a plurality of times to build a histogram of said jitter.

14. A method as claimed in claim 1, further comprising the step of delaying by a predetermined delay one of the first and second events so as to delay the corresponding respective triggering of one of said first oscillator circuit and said second oscillator circuit by said predetermined delay.

15. A method as claimed in claim 1, wherein said oscillation period $T_s$ is greater than said oscillation period $T_f$.

16. A method as claimed in claim 1, wherein said count is a count of said number of cycles, $N_m$, of said second oscillator circuit.

17. A method for measuring a time difference between a first event and a second event, comprising the steps of:

triggering a plurality of first oscillator circuits to generate a plurality of first oscillation signals upon detection of said first event, each of said plurality of first oscillator circuits being triggered after a different predetermined delay and wherein each of said plurality of first oscillation signals has an oscillation period $T_s$;

triggering a second oscillator circuit to generate a second oscillation signal with an oscillation period $T_f$ upon detection of said second event, wherein $T_s$ is not equal to $T_f$ and wherein a difference, $\Delta T$, between $T_s$ and $T_f$ is small with respect to either of $T_s$ and $T_f$;

counting a number of cycles, $N_m$, of said second oscillator circuit;

determining which one of said plurality of first oscillator circuits corresponds to providing a first change of phase, said first change of phase being detected when a relative position of any of said plurality of first oscillation signals goes from a leading to lagging relationship with respect to said second oscillation signal; and determining the time difference between said first and said second events from said difference $\Delta T$ between $T_s$ and $T_f$, the count of number of cycles of said second oscillator circuit at which said first detected change of phase change is detected, and a corresponding value of said predetermined delay for said one of said plurality of first oscillator circuits corresponding to said first detected change of phase.

18. A method as claimed in claim 17 further comprising a step of performing a calibration procedure prior to measuring the time difference between said first and second events.

19. A method as claimed in claim 18, wherein said calibration procedure comprises a plurality of calibration sequences for each of said plurality of first oscillator circuits with respect to said second oscillator circuit.

20. A method as claimed in claim 17, wherein said first event is a rising edge of a data signal and said second event is a rising edge of a clock signal and wherein said time difference is a value of jitter.

21. A method as claimed in claim 20, further comprising repeating all steps a plurality of times to build a histogram of said jitter.

22. A method as claimed in claim 17, further comprising the step of delaying by a predetermined delay one of the first and second events so as to delay the corresponding respective triggering of one of said plurality of first oscillator circuits and said second oscillator circuit by said predetermined delay.

23. A method as claimed in claim 17, wherein said oscillation period $T_s$ is greater than said oscillation period $T_f$.

24. An apparatus for measuring a time difference between a first event and a second event, comprising:

- a first oscillator circuit adapted to generate a first oscillation signal with an oscillation period $T_s$ upon detection of said first event;
- a second oscillator circuit adapted to generate a second oscillation signal with an oscillation period $T_f$ upon detection of said second event, wherein $T_s$ is not equal to $T_f$ and wherein a difference, $\Delta T$, between $T_s$ and $T_f$ is small with respect to either of $T_s$ and $T_f$;
- means for detecting a change of phase between said first and second oscillation signals; and
- means for determining the time difference between said first and second events using said difference $\Delta T$ between $T_s$ and $T_f$ and a count of a number of cycles of only one of said first oscillator circuit and said second oscillator circuit at which said detected change of phase occurs.

25. An apparatus as claimed in claim 24 wherein said first and second oscillator circuits are ring oscillator circuits.

26. An apparatus as claimed in claim 25 wherein said first oscillator circuit comprises a first inverter with a propagation delay of $\tau_s$, wherein an output of said first inverter is connected into an input of said first inverter using a first switch and wherein said first switch is closed upon detection of said first event.

27. An apparatus as claimed in claim 25 wherein said second oscillator circuit comprises a second inverter with a propagation delay of $\tau_f$, wherein an output of said first second inverter is connected into an input of said second inverter using a second switch and wherein said second switch is closed upon detection of said second event.

28. An apparatus as claimed in claim 24, wherein said first event is a rising edge of a data signal and said second event is a rising edge of a clock signal and wherein said time difference is a value of jitter.

29. An apparatus as claimed in claim 28 further comprising an integrator for accumulating and processing a plurality of measured time differences to build a histogram of said jitter.

30. An apparatus as claimed in claim 24, further comprising a delay element coupled to one of said first oscillator circuit and said second oscillator circuit and operatively configured for delaying by a predetermined delay the detection of the corresponding respective one of the first event and the second event by the corresponding respective one of said first oscillator circuit and said second oscillator circuit.

31. A method as claimed in claim 24, wherein said oscillation period $T_s$ is greater than said oscillation period $T_f$.

32. An apparatus as claimed in claim 24, wherein said means for determining the difference uses said count of said number of cycles of said second oscillator circuit.

33. An apparatus for measuring a time difference between a first event, and a second event, comprising:

- a plurality of first oscillator circuits adapted to generate a plurality of first oscillation signals upon detection of said first event, wherein each of said plurality of first oscillator circuits has associated therewith a different predetermined delay and wherein each of said plurality of first oscillation signals has an oscillation period $T_s$;
- a second oscillator circuit adapted to generate a second oscillation signal with an oscillation period $T_f$ upon detection of said second event, wherein $T_s$ is not equal to $T_f$ and wherein a difference, $\Delta T$, between $T_s$ and $T_f$ is small with respect to either $T_s$ and $T_f$;
- at least one counter for counting a number of cycles, $N_m$, of said second oscillator circuit;
- a plurality of phase detectors for detecting a respective phase difference between each of said plurality of first oscillation signals and said second oscillation signal;
- a controller for determining which one of said plurality of first oscillator circuits corresponds to detecting a first phase change, said controller operatively configured to determine said first phase change when a relative position of any of said plurality of first oscillation signals goes from a leading to a lagging situation with respect to said second oscillation signal; and
- means for determining the time difference between said first and said second events from said difference $\Delta T$ between $T_s$ and $T_f$, the count of number of cycles of said second oscillator circuit at which said first phase change is detected, and a corresponding value of said predetermined delay for said one of said plurality of first oscillator circuits corresponding to said detected phase change.

34. An apparatus as claimed in claim 33, further comprising a delay element coupled to one of (a) said plurality of first oscillator circuits and (b) said second oscillator circuit and operatively configured for delaying by a predetermined delay the detection of the corresponding respective one of the first event and the second event by the corresponding respective one of (a) said plurality of first oscillator circuits and (b) said second oscillator circuit.

35. A method as claimed in claim 33, wherein said oscillation period $T_s$ is greater than said oscillation period $T_f$.

36. A method for measuring a time difference between a first signal and a reference signal using a first oscillator circuit adapted to generate a first oscillation signal having a period $T_s$ and a second oscillator circuit adapted to generate a second oscillation signal having a period $T_f$, said method comprising the steps of:

- performing a calibration sequence to determine the oscillation period $T_s$ of said first oscillator circuit, the oscillation period $T_f$ of said second oscillator circuit and a measure of an intrinsic path delay difference between said first and second signals;
- triggering said first oscillator circuit to generate said first oscillation signal in response to said first signal;
- triggering said second oscillator circuit to generate said second oscillation signal in response to said reference signal, wherein $T_s$ is not equal to $T_f$ and wherein a difference, $\Delta T$, between $T_s$ and $T_f$ small with respect to either of $T_s$ and $T_f$;
- detecting a change of phase between said first and second oscillation signals; and
- determining the time difference between said first signal and said reference signal from said difference, $\Delta T$, between $T_s$ and $T_f$ and a count of a number of cycles of one of said first oscillator circuit and said second oscillation signal at which said detected change of phase occurs.

37. A method as claimed in claim 36 wherein the step of performing the calibration sequence comprises the steps of:

triggering said first and second oscillator circuits in response to said reference signal to generate respective first and second calibration oscillation signals;

counting a number of cycles, $N_o$, of said second calibration oscillation signal until a first change of phase is detected between said first and second calibration oscillation signals, said first change of phase being the first occurrence when a relative position of said first calibration oscillation signal goes from a leading to lagging relationship with respect to said second calibration oscillation signal;

counting a number of cycles, $N_d$, of said second calibration oscillation signal until a subsequent change of phase is detected between said first and second calibration oscillation signals;

measuring a period of time, $T_{od}$, from said first detected change of phase to said subsequent detected change of phase; and computing the oscillation periods $T_s$ and $T_f$ of said first and second oscillator circuits using $N_o$, $N_d$, and $T_{od}$.

38. A method as claimed in claim 36, further comprising the step of delaying by a predetermined delay one of the first and second events so as to delay the corresponding respective triggering of one of said first oscillator circuit and said second oscillator circuit by said predetermined delay.

39. A method as claimed in claim 36, wherein said oscillation period $T_s$ is greater than said oscillation period $T_f$.

40. A method as claimed in claim 36, wherein said count is a count of said number of cycles of said second oscillator circuit.

* * * * *

UNITED STATES PATENT AND TRADEMARK OFFICE
CERTIFICATE OF CORRECTION

PATENT NO. : 6,850,051 B2 Page 1 of 1
APPLICATION NO. : 10/105434
DATED : February 1, 2005
INVENTOR(S) : Gordon W. Roberts and Antonio H. Chan It is certified that error appears in the above-identified patent and that said Letters Patent is hereby corrected as shown below:

In claim 5, column 15, line 14, delete “art” and insert -- an -- therefor.

In claim 8, column 15, line 46, delete $N_o$” and insert -- $N_d$-- therefor.

In claim 36, column 18, line 58, after “$T_f$” insert the word --is -- therefor.

Signed and Sealed this

Twenty-eighth Day of November, 2006

JON W. DUDAS
*Director of the United States Patent and Trademark Office*